(12) United States Patent
Maki et al.

(10) Patent No.: US 7,270,258 B2
(45) Date of Patent: Sep. 18, 2007

(54) METHOD OF FABRICATION OF SEMICONDUCTOR INTEGRATED CIRCUIT DEVICE

(75) Inventors: Hiroshi Maki, Ryuou (JP); Yukio Tani, Ryuou (JP)

(73) Assignees: Renesas Technology Corp., Tokyo (JP); Renesas Eastern Japan Semiconductor, Inc., Tokyo (JP)

( * ) Notice: Subject to any disclaimer, the term of this patent is extended or adjusted under 35 U.S.C. 154(b) by 343 days.

(21) Appl. No.: 10/901,999

(22) Filed: Jul. 30, 2004

(65) Prior Publication Data

US 2005/0061856 A1 Mar. 24, 2005

(30) Foreign Application Priority Data

Sep. 19, 2003 (JP) ............................. 2003-327046

(51) Int. Cl.
*B23K 31/02* (2006.01)

(52) U.S. Cl. .................. 228/234.1; 228/235.1
(58) Field of Classification Search ............ 228/234.1, 228/235.1
See application file for complete search history.

(56) References Cited

U.S. PATENT DOCUMENTS

| | | | | |
|---|---|---|---|---|
| 3,617,682 A | * | 11/1971 | Hall | 219/85.18 |
| 4,607,779 A | * | 8/1986 | Burns | 228/106 |
| 4,883,214 A | * | 11/1989 | Zimmer | 228/9 |
| 6,798,072 B2 | * | 9/2004 | Kajiwara et al. | 257/778 |
| 7,075,036 B2 | * | 7/2006 | Ogimoto et al. | 219/243 |
| 2002/0092610 A1 | * | 7/2002 | Funaya et al. | 156/273.3 |
| 2006/0076388 A1 | * | 4/2006 | Sato | 228/102 |

FOREIGN PATENT DOCUMENTS

| | | | |
|---|---|---|---|
| EP | 1 030 349 A2 | | 8/2000 |
| EP | 1030349 A2 | * | 8/2000 |
| JP | 5-2177 | | 1/1993 |
| JP | 11121532 A | * | 4/1999 |
| JP | 2000100837 A | * | 4/2000 |
| JP | 2002-534799 | | 10/2002 |
| JP | 2004096048 A | * | 3/2004 |

* cited by examiner

*Primary Examiner*—Kevin P. Kerns
(74) *Attorney, Agent, or Firm*—Antonelli, Terry, Stout & Kraus, LLP.

(57) ABSTRACT

Productivity is to be improved in assembling a semiconductor integrated circuit device. A matrix substrate is provided and semiconductor chips are disposed on a first heating stage, and then the matrix substrate is disposed above the semiconductor chips on the first heating stage. Subsequently, the semiconductor chips and the matrix substrate are bonded to each other temporarily by thermocompression bonding, while heating the chips directly by the first heating stage. Thereafter, the temporarily bonded matrix substrate is disposed on a second heating stage adjacent to the first heating stage, and then, on the second heating stage, the semiconductor chips are thermocompression-bonded to the matrix substrate, while being heated directly by the second heating stage.

5 Claims, 21 Drawing Sheets

FIG. 12
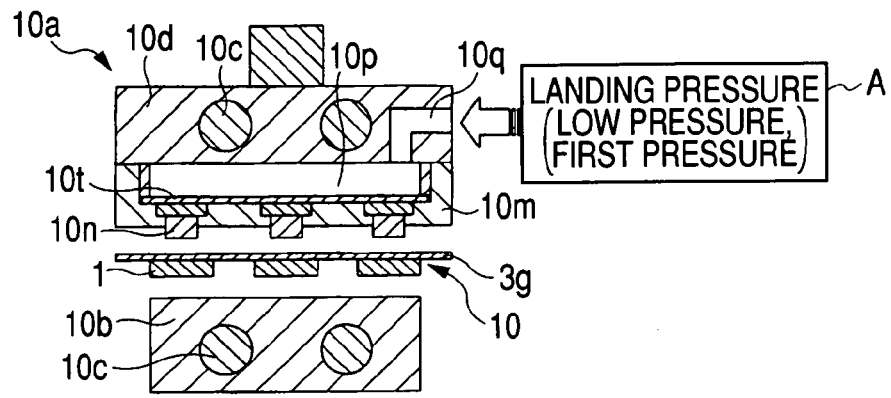
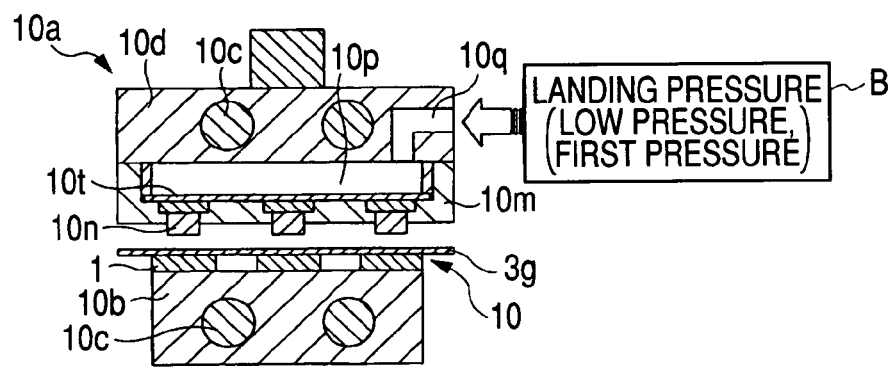
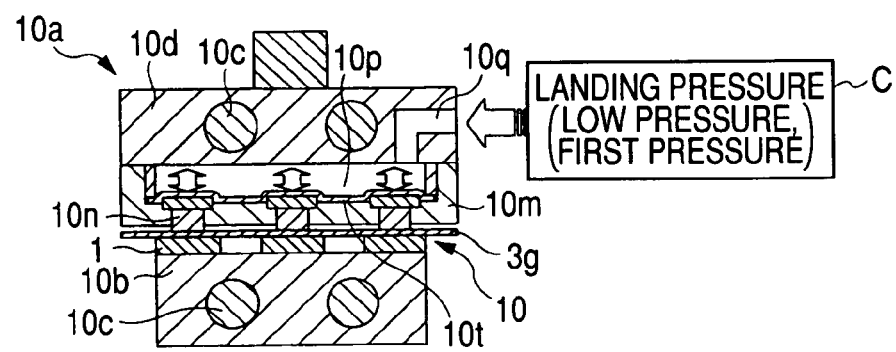
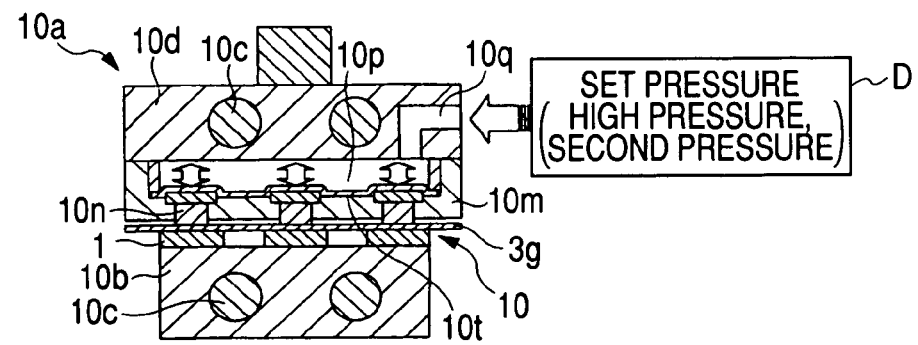

FIG. 13
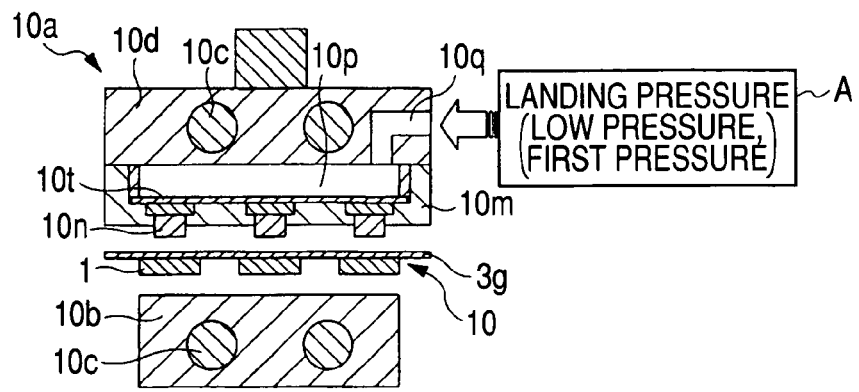
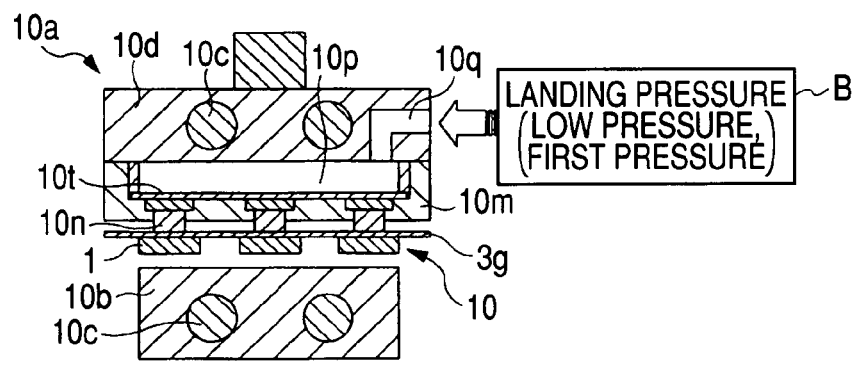
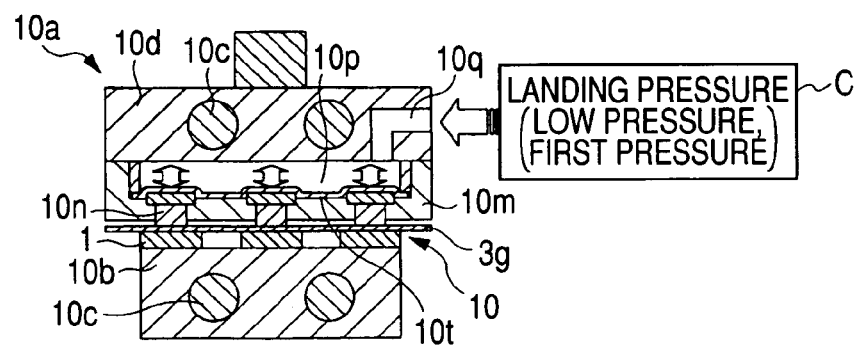
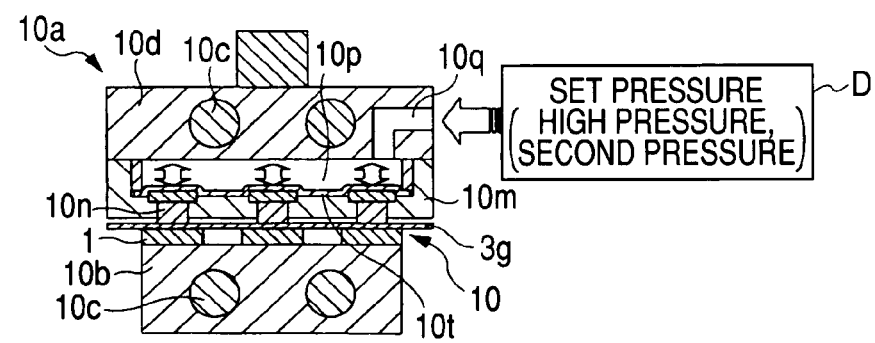

METHOD OF FABRICATION OF SEMICONDUCTOR INTEGRATED CIRCUIT DEVICE

CROSS-REFERENCE TO RELATED APPLICATION

The present application claims priority from Japanese Patent application JP 2003-327046, filed on Sep. 19, 2003, the content of which is hereby incorporated by reference into this application.

BACKGROUND OF THE INVENTION

The present invention relates to a method of fabricating a semiconductor integrated circuit device, and, more particularly, to a technique for use in the fabrication of a semiconductor integrated circuit device wherein a semiconductor chip is bonded to a substrate.

In the conventional way of providing bonding between a substrate and silicon chips, the substrate is disposed on a substrate rest (stage); then, plural silicon chips are arranged on the substrate; and heat is conducted to the silicon chips through the substrate by means of a heating cartridge provided on the substrate rest (see, for example, Patent Literature 1 and Patent Literature 2, which is a European patent application corresponding to Patent Literature 1).

[Patent Literature 1]
Japanese Unexamined Patent Publication No. 2002-534799
(FIG. 2)
[Patent Literature 2]
EP 1030349A2 (FIG. 2)

SUMMARY OF THE INVENTION

To effect bonding between a wiring substrate and semiconductor chips by flip-chip connection, the semiconductor chips are picked up from a semiconductor wafer; then they are disposed on the substrate in such a manner that their main surfaces face toward the substrate; and, thereafter, the chips and the substrate are bonded together by thermocompression bonding, for example.

Therefore, a mechanism for conveying the semiconductor chips onto the wiring substrate is disposed above the substrate. On the other hand, it is difficult to dispose a heating mechanism above the wiring substrate because of the fact that the conveyance mechanism is disposed above the substrate, and, therefore, the heating mechanism typically is embedded into a stage located below the wiring substrate.

In this structure, if heating is conducted from the stage side, the chip-substrate bonding portions are heated through the wiring substrate, so that the temperature of the bonding portions does not rise to a satisfactory extent, thus causing the problem of imperfect bonding. On the other hand, if the heating temperature is set high to obtain a sufficient temperature of the bonding portions, various problems arise, such as warping of the wiring substrate and peel-off of the compression-bonded portions, or an inconvenience occurs in a later step.

It is an object of the present invention to provide a method of fabricating a semiconductor integrated circuit device that is capable of improving the productivity.

It is another object of the present invention to provide a method of fabricating a semiconductor integrated circuit device that capable of stabilizing the chip bonding quality.

The above and other objects and novel features of the present invention will become apparent from the following description and the accompanying drawings.

Typical modes of the present invention as disclosed herein will be outlined below.

In accordance with the present invention, plural semiconductor chips are arranged in such a manner that respective main surfaces face upward, and then a substrate disposed above the plural semiconductor chips and the semiconductor chips are bonded together by thermocompression bonding.

Other modes of the present invention will be described below paragraph by paragraph.

1. A method of fabricating a semiconductor integrated circuit device, comprises the steps of:
   (a) providing a substrate;
   (b) disposing a plurality of semiconductor chips on a stage in such manner that respective main surfaces face upward;
   (c) disposing the substrate above the plural semiconductor chips; and
   (d) bonding the plural semiconductor chips all together to the substrate by thermocompression bonding (compression bonding or adhesion under heating).

2. A method according to the above paragraph 1, wherein an organic substrate is used as the substrate.

3. A method of fabricating a semiconductor integrated circuit device, comprises the steps of:
   (a) providing a substrate;
   (b) disposing a plurality of semiconductor chips on a heating stage;
   (c) disposing the substrate above the plural semiconductor chips; and
   (d) pressurizing the plural semiconductor chips correspondingly by plural pressure blocks while heating the semiconductor chips directly by the heating stage, the plural pressure blocks each being supported for independent movement in corresponding relation to the semiconductor chips, thereby thermocompression-bonding the semiconductor chips all together to the substrate.

4. A method according to the above paragraph 3, wherein at the time of pinching and compression-bonding the substrate and the semiconductor chips by the use of plural pressure blocks and the heating stage, air at a first pressure is applied to the plural pressure blocks prior to compression-bonding; then, in this state, the pressure blocks are brought into contact with the substrate, or the semiconductor chips are brought into contact with the heating stage; and, thereafter, air at a second pressure higher than the first pressure is applied to the pressure blocks to effect thermocompression bonding.

5. A method according to the above paragraph 3, wherein the pressure applied to the pressure blocks in step (d) is raised gradually from a low pressure and a point of change of a load imposed on a load change detecting means is detected by the load change detecting means to determine the magnitude of the pressure applied to the plural semiconductor chips, the load change detecting means being connected to support block portions for supporting the plural pressure blocks.

6. A method according to the above paragraph 3, wherein, prior to the step (b), the plural pressure blocks and the heating stage are brought into contact with each other, and then, in this state, the pressure applied to the pressure blocks is raised gradually from a low pressure, and a point of change of a load imposed on a load change detecting means is detected by the load change detecting means, the load change detecting means being connected to support block portions for supporting the plural pressure blocks to determine the magnitude of a set value of the pressure applied to the pressure blocks at the time of thermocompression-bonding the plural semiconductor chips disposed on the heating stage to the substrate.

7. A method according to the above paragraph 3, wherein the plural pressure blocks are pressurized by air through a single sheet-like elastic film.

8. A method of fabricating a semiconductor integrated circuit device, comprises the steps of:
(a) providing a substrate;
(b) disposing a plurality of semiconductor chips on a first heating stage;
(c) disposing the substrate above the semiconductor chips disposed on the first heating stage and thereafter bonding the semiconductor chips and the substrate to each other temporarily by thermocompression bonding while heating the semiconductor chips directly by the first heating stage;
(d) after the step (c), disposing the temporarily bonded semiconductor chips and substrate on a second heating stage adjacent to the first heating stage; and
(e) pressurizing the semiconductor chips over the second heating stage for a longer time than in the first heating stage while heating the semiconductor chips directly by the second heating stage to effect a main bonding of the semiconductor chips and the substrate by thermocompression bonding.

9. A method according to the above paragraph 8, wherein the plural semiconductor chips are arranged on the second heating stage and the plural semiconductor chips are all together subjected to a main bonding to the substrate by thermocompression bonding while being heated directly by the second heating stage.

10. A method according to the above paragraph 8, wherein, prior to the step (b), a high pressure is applied to a plurality of pressure blocks each of which are supported for independent movement in corresponding relation to plural semiconductor chips, the high pressure being high to such an extent that the pressure blocks are not pushed up, then in this state the plural pressure blocks and the second heating stage are brought into contact with each other, and a point of change of a load imposed on a load change detecting means is detected by the load change detecting means to determine a landing height of the plural pressure blocks, the load change detecting means being connected to support block portions for supporting the pressure blocks.

11. A method according to the above paragraph 8, wherein support block portions for supporting a plurality of pressure blocks each of which are supported for independent movement in corresponding relation to the plural semiconductor chips are mounted to a body portion removably.

12. A method according to the above paragraph 11, wherein the support block portions are mounted to the body portion removably through a spacer.

13. A method according to the above paragraph 8, wherein a plurality of small-sized stages smaller than a back surface of each of the semiconductor chips are provided on the second heating stage, and the semiconductor chips are disposed on the plural small-sized stages.

14. A method according to the above paragraph 8, wherein a plurality of suction systems which are open to the chips-disposed side of the second heating stage are provided in the second heating stage, and at the time of thermocompression bonding of the semiconductor chips and the substrate, dust particles adhered to the chips-disposed side are removed by suction through suction systems provided in the second heating stage.

15. A method of fabricating a semiconductor integrated circuit device, comprises the steps of:
(a) providing a substrate;
(b) disposing a semiconductor chip on a heating stage;
(c) disposing the substrate above the semiconductor chip; and
(d) heating the semiconductor chip by the heating stage and heating the substrate by a heating means disposed above the substrate in such a manner that the heating temperature on the semiconductor chip side is higher than that on the substrate side, and bonding the semiconductor chip and the substrate to each other by thermocompression bonding.

16. A method according to the above paragraph 15, wherein the substrate is heated at a temperature of not higher than 150° C. by the heating means.

17. A method according to the above paragraph 15, wherein the substrate is heated at a temperature of not higher than 100° C. by the heating means.

18. A method according to the above paragraph 15, wherein the substrate is heated at a temperature of not higher than 50° C. by the heating means.

19. A method according to the above paragraph, wherein the substrate is heated at a normal temperature by the heating means.

20. A method according to the above paragraph 15, wherein an organic substrate is used as the substrate.

Still other modes of the present invention will be outlined below paragraph by paragraph.

1. A method of fabricating a semiconductor integrated circuit device, comprises the steps of:
(a) providing a matrix substrate on which a plurality of device areas each for the semiconductor integrated circuit device are formed in a matrix array;
(b) disposing a plurality of semiconductor chips onto a stage in such a manner that respective main surfaces face upward;
(c) disposing the matrix substrate above the plural semiconductor chips; and
(d) bonding the semiconductor chips to the matrix substrate by thermocompression bonding simultaneously in one or plural rows in the width direction of the matrix-arrayed device areas on the matrix substrate.

2. A method of fabricating a semiconductor integrated circuit device, comprises the steps of:
(a) providing a matrix substrate on which a plurality of device areas each for the semiconductor integrated circuit device are formed in a matrix array;
(b) disposing a plurality of semiconductor chips onto a heating stage;
(c) disposing the matrix substrate above the plural semiconductor chips; and
(d) pressurizing the plural semiconductor chips corresponding respectively to a plurality of pressure blocks while heating the semiconductor chips directly by the heating stage, the plural pressure blocks each being supported for independent movement in corresponding relation to the semiconductor chips to bond the semiconductor chips to the matrix substrate by thermocompression bonding simultaneously in one or plural rows in the width direction of the matrix-arrayed device areas on the matrix substrate.

Still other modes of the present invention will be outlined below paragraph by paragraph.

3. A semiconductor device fabricating apparatus comprises:
(a) a heating stage which permits a plurality of semiconductor chips to be disposed thereon;

(b) a support block portion having a plurality of pressure blocks and a space for the supply of air to pressurize the plural pressure blocks, the pressure blocks each being supported for independent movement in corresponding relation to the plural semiconductor chips;

(c) an air introducing portion for introducing air into the space of the support block portion; and (d) a load change detecting means connected to the support block portion to detect a point of change of a load.

4. A semiconductor device fabricating apparatus comprises:

(a) a heating stage which permits a plurality of semiconductor chips to be disposed thereon;

(b) a support block portion mounted removably to a body portion and having a plurality of pressure blocks and a space for the supply of air to pressurize the plural pressure blocks;

(c) an air introducing portion for introducing air into the space of the support block portion; and (d) a load change detecting means connected to the support block portion to detect a point of change of a load.

5. A semiconductor device fabricating apparatus comprises:

(a) a heating stage having a plurality of small-sized stages, the small-sized stages permitting a plurality of semiconductor chips to be respectively disposed thereon and each being smaller than a back surface of each of the semiconductor chips;

(b) a support block portion having a plurality of pressure blocks and a space for the supply of air to pressurize the plural pressure blocks, the pressure blocks each being supported for independent movement in corresponding relation to the plural semiconductor chips;

(c) an air introducing portion for introducing air into the space of the support block portion; and (d) a load change detecting means connected to the support block portion to detect a point of change of a load.

6. A semiconductor device fabricating apparatus comprises:

(a) a heating stage which permits a plurality of semiconductor chips to be disposed thereon;

(b) a support block portion having a plurality of pressure blocks and a space for the supply of air to pressurize the plural pressure blocks, the pressure blocks each being supported for independent movement in corresponding relation to the plural semiconductor chips;

(c) a sheet-like elastic film disposed within the support block portion so as to be in close contact with the plural pressure blocks;

(d) an air introducing portion for introducing air into the space of the support block portion; and (e) a load change detecting means connected to the support block portion to detect a point of change of a load.

The following is a brief description of effects obtained by typical modes of the present invention as disclosed herein.

Die bonding is carried out in a divided manner into a temporary bonding and a main bonding with use of first and second heating stages. The temporary bonding is carried out in a short time using the first heating stage, and, subsequently, the main bonding is carried out for plural semiconductor chips simultaneously using the second heating stage, whereby it is possible to shorten the bonding time. Consequently, it is possible to improve the throughput of die bonding and, hence, to improve the productivity thereof.

BRIEF DESCRIPTION OF THE DRAWINGS

FIG. 12 is a sectional view showing an example of the operation flow at the time of a low load landing of the principal portion illustrated in FIG. 11;

FIG. 13 is a sectional view showing a modified example of the operation flow at the time of a low load landing of the principal portion illustrated in FIG. 11;

DETAILED DESCRIPTION OF PREFERRED EMBODIMENTS

Figure 1:
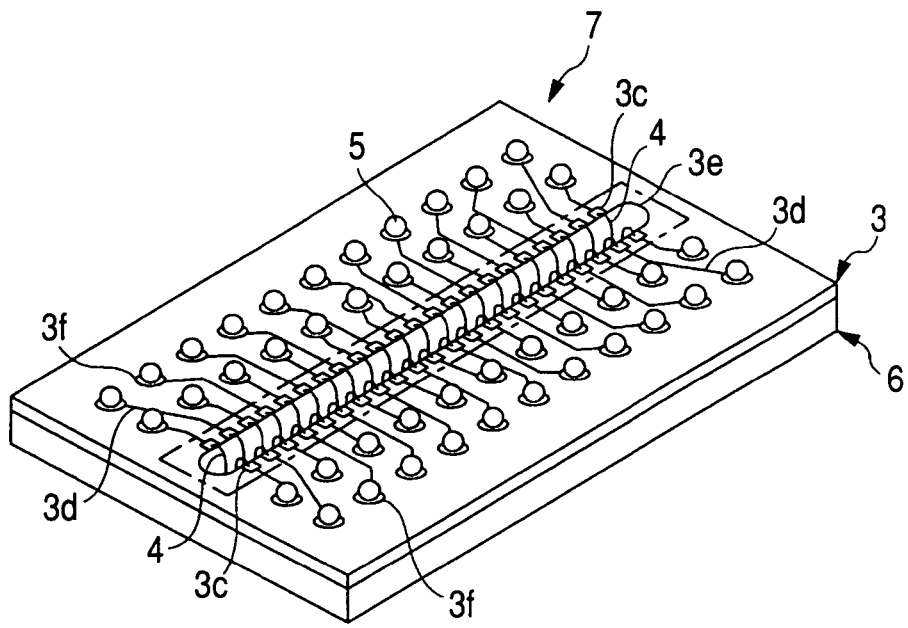
FIG. 1 is a perspective view showing an example of the structure on an external terminal side of a semiconductor integrated circuit device embodying the present invention.

In the following description of the embodiments, as to the same or similar portions, repeated explanations thereof will be omitted in principle except where required.

Where required for convenience' sake, the subject matter of the invention will be described in a divided manner into plural sections or embodiments, but unless otherwise mentioned, they are not unrelated to each other, but are to be considered in a relation such that one is a modification, a description of details, or a supplementary explanation, of part or the whole of the other.

In the following description of the embodiments, when reference is made to a number of elements (including a number, numerical value, quantity, and range), no limitation is made to the number referred to, but values above and below the number referred to will do as well, unless otherwise mentioned and except in the case where it is basically evident that a limitation is made to the number referred to.

When reference is made to a component of a member (e.g., a member X comprising A), the inclusion of other components is not excluded, unless otherwise mentioned or except in the case where a negative answer is evident. This is also true of an ambient gas and the like.

The term "semiconductor integrated circuit device (simply semiconductor chip)" as referred to herein is meant to include not only one fabricated on a silicon semiconductor chip, but also one fabricated on an SOI substrate and those fabricated on other substrates, such as TFT liquid crystal, unless otherwise mentioned.

Likewise, the term "integrated circuit chip" as referred to herein is meant to include not only a silicon single crystal chip", but also an SOI substrate, a GaAs substrate, and a generally square or rectangular integrated circuit substrate for the fabrication of TFT liquid crystal, unless otherwise mentioned.

The present invention will be described in detail hereinunder with reference to the accompanying drawings. In all of the drawings, members having the same functions are identified by the same reference numerals, and repeated explanations thereof will be omitted.

EMBODIMENTS

A semiconductor integrated circuit device embodying the present invention is in the form of a resin-sealed semiconductor package wherein an organic substrate 3 serving as a wiring substrate and a semiconductor chip 1 are bonded together. In this embodiment, reference will be made as an example to a BOC (Board On Chip) 7, as shown in FIG. 1.

Figure 2:
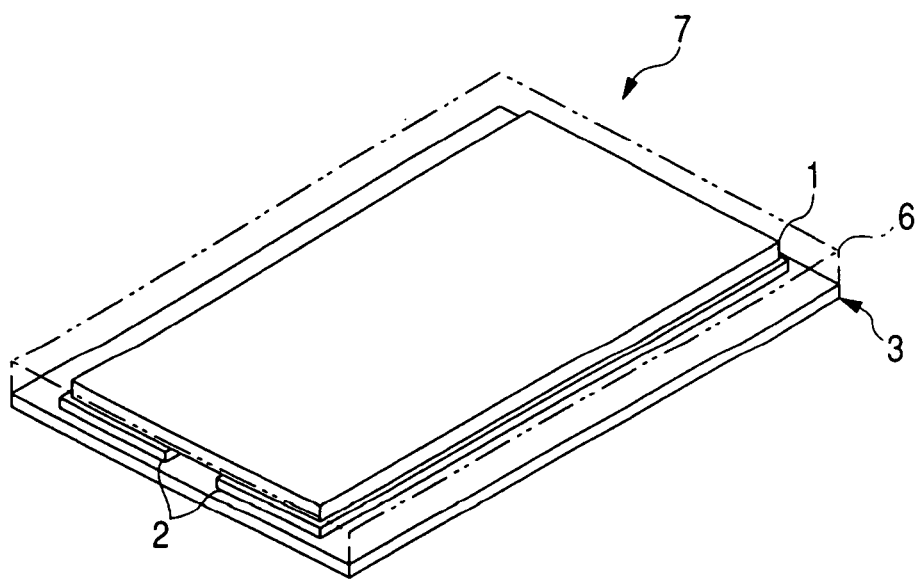
FIG. 2 is a perspective view showing, through a sealing member, an example of the chip-side internal structure of the semiconductor integrated circuit device illustrated in FIG. 1.

A description will now be given of the structure of the BOC 7 shown in FIGS. 1 to 3. The BOC 7 comprises an organic substrate 3. The organic substrate 3 has an elongated aperture 3e formed centrally and longitudinally of one face of the organic substrate. Bump lands 3f are formed in two rows on each of both sides of the aperture 3e, plural bonding electrodes 3c are formed in proximity to the aperture 3e, and wires 3d are provided for connecting the bump lands 3f and the bonding electrodes 3c electrically with each other.

A semiconductor chip 1 is bonded to the opposite face of the organic substrate 3 through die bonding tapes 2, and plural wires 4 are used for connecting pads (surface electrodes) 1a on the semiconductor chip 1 and corresponding bonding electrodes 3c with each other electrically. A sealing member 6 seals the semiconductor chip 1 and the plural wires 4 with resin, and plural solder balls 5 are provided external terminals formed on the bump lands 3f, respectively.

The semiconductor chip 1 is formed of silicon, for example, and an integrated circuit is incorporated therein. The semiconductor chip 1 is bonded to the organic substrate 3 through die bonding tapes 2 (also called elastomer, die attaching tapes, or die bonding films) in such a manner that a main surface (first main surface) 1b thereof faces the substrate.

Figure 3:
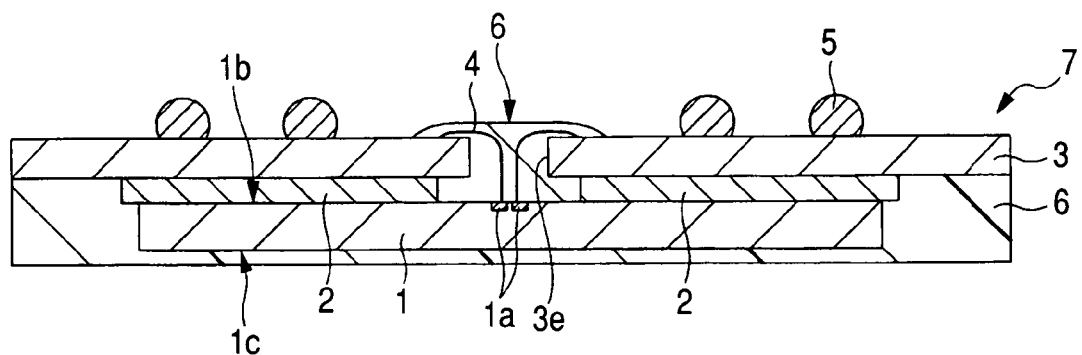
FIG. 3 is a sectional view showing a structural example of the semiconductor integrated circuit device illustrated in FIG. 1.

More specifically, the organic substrate 3 is disposed on the main surface 1b of the semiconductor chip 1 through die bonding tapes 2; and, as shown in FIG. 3, the pads 1a on the semiconductor chip 1 and corresponding bonding electrodes 3c shown in FIG. 1 are connected with each other through the aperture 3e formed in the organic substrate 3 and through the wires 4. For example, the wires 4 are gold wires.

The organic substrate 3 is an organic wiring substrate, which comprises a base formed of an organic material, as well as wires 3d formed of copper, for example, and bump lands 3f and bonding electrodes 3c, which are all formed on the base. The wires 3d are covered, insulated and protected with a solder resist film, which is an organic insulating film (organic layer). The sealing member 6 is an epoxy resin for example.

The following description is directed to the manner of assembling the BOC 7.

Figure 4:
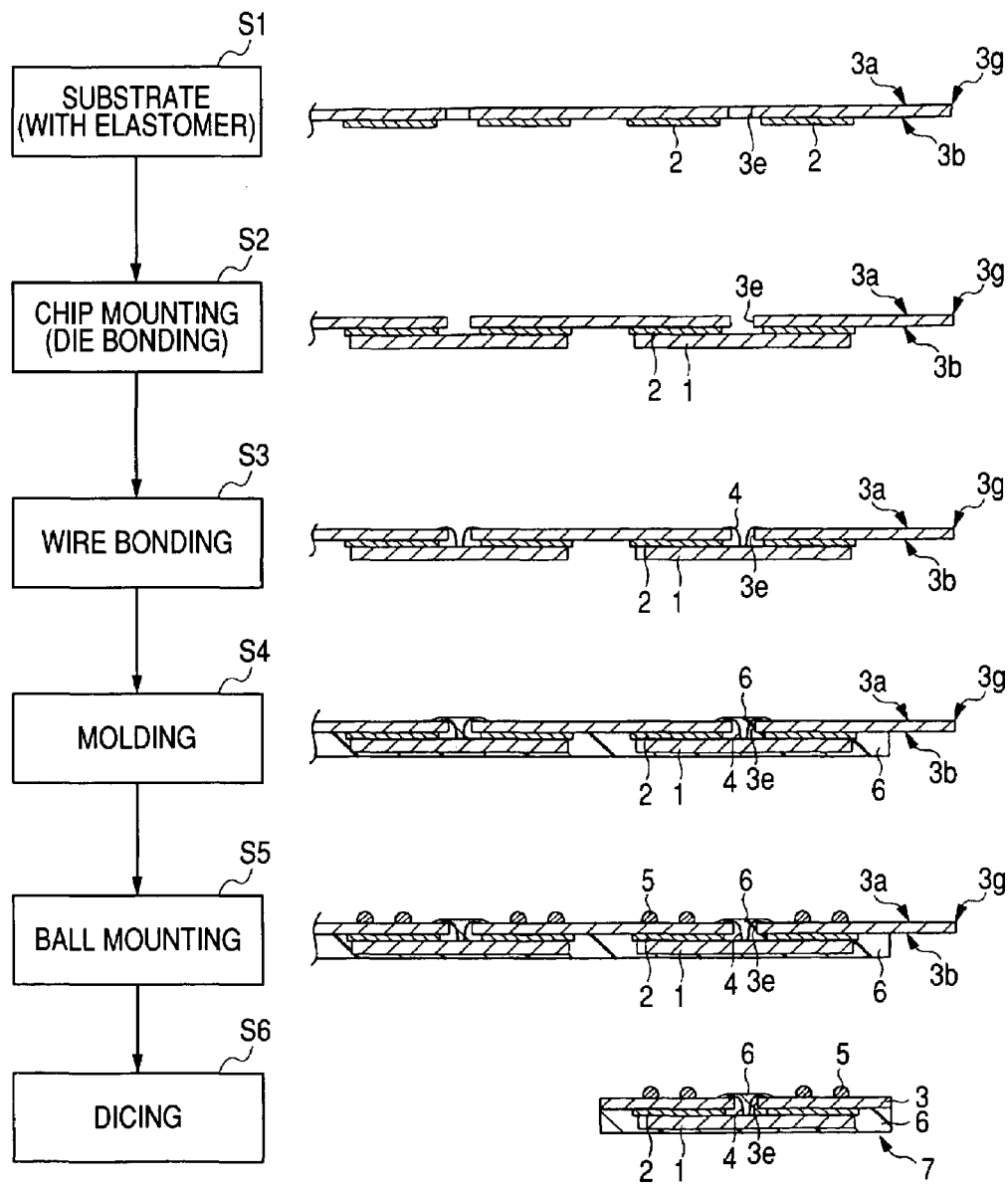
FIG. 4 is a fabrication process flow chart showing an example of an assembling procedure for the semiconductor integrated circuit device illustrated in FIG. 1.
Figure 5:
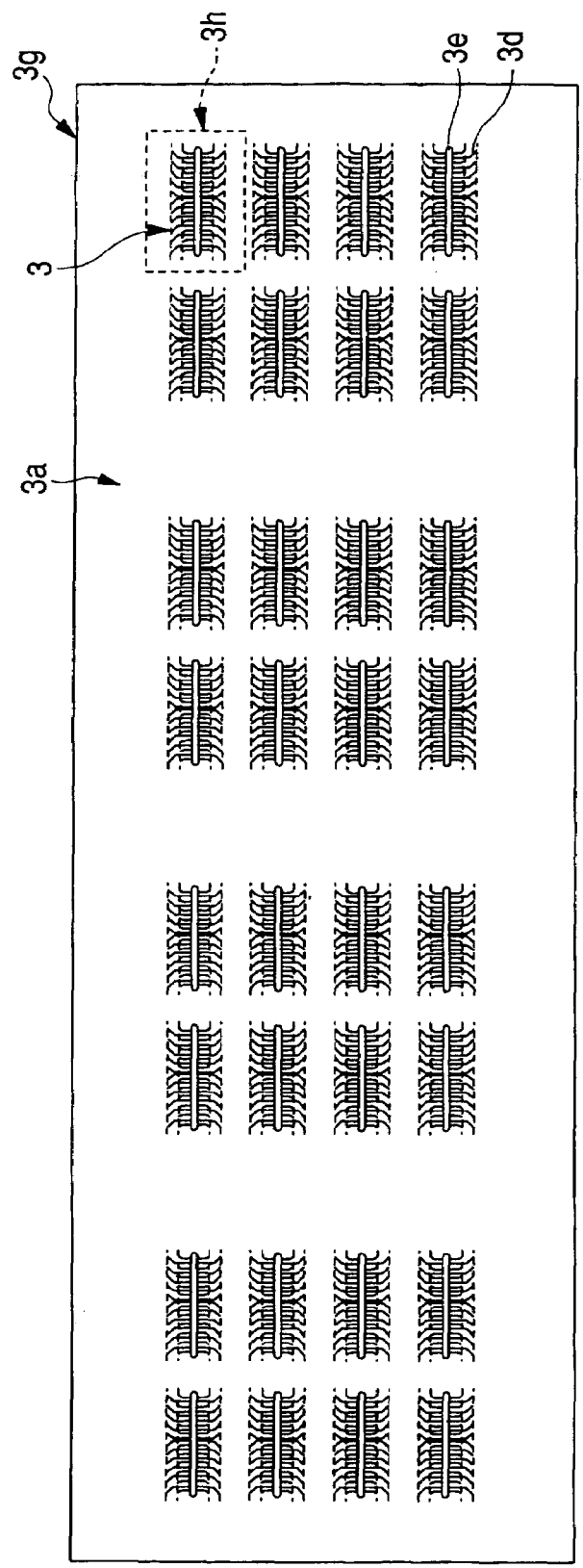
FIG. 5 is a plan view showing an example of the structure on a surface side of a wiring substrate in the assembling procedure illustrated in FIG. 4.

First, as shown in step S1 in FIG. 4, and also shown in FIG. 5, a matrix substrate 3g is provided having device areas 3h representing plural areas of BOCs 7 arranged in matrix form. That is, the matrix substrate 3g has plural organic substrates 3. FIG. 5 illustrates the structure of a surface 3a side of the matrix substrate 3g. In each device area 3h, plural wires 3d are formed on both sides of a central aperture 3e.

Figure 6:
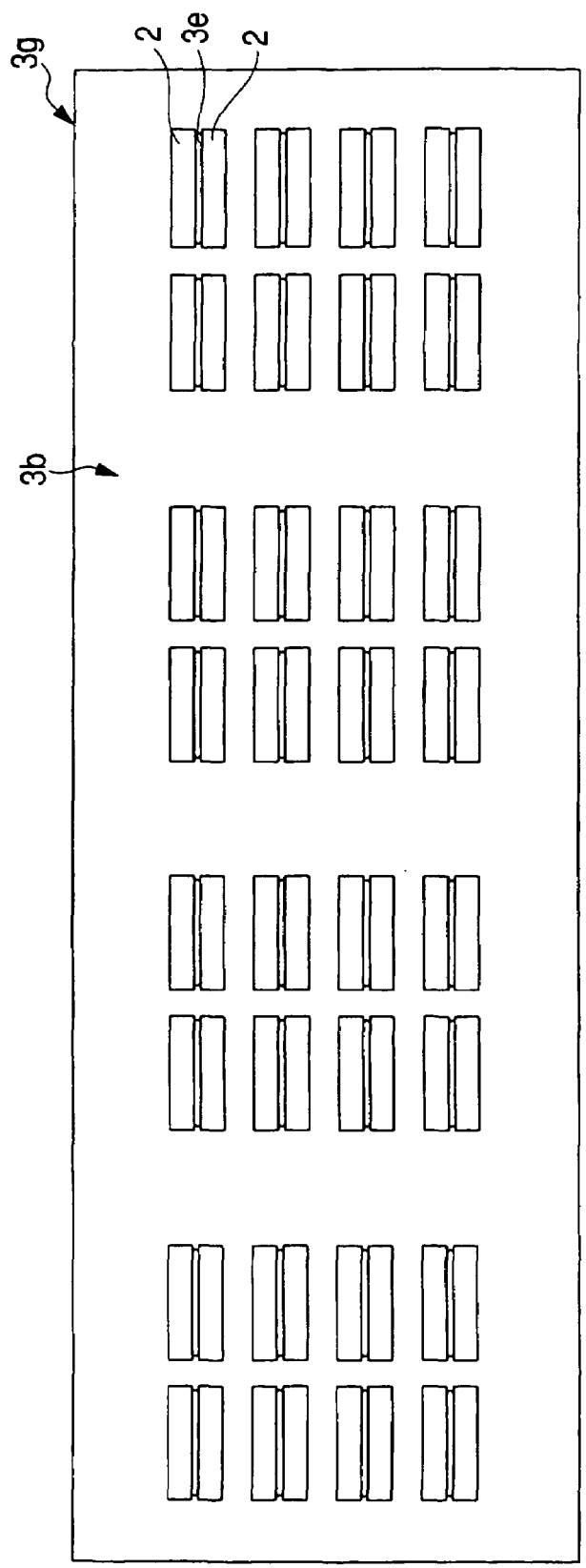
FIG. 6 is a plan view showing an example of the structure on a back surface side of the wiring substrate in the assembling procedure illustrated in FIG. 4.

FIG. 6 illustrates the structure of a back surface 3b side of the matrix substrate 3g. Die bonding tapes 2 such as an elastomer are affixed to both sides of the central aperture 3e. The die bonding tapes 2, or elastomer, may be replaced by an adhesive such as a thermoplastic resin. It is optional whether the adhesive is to be thermoplastic or thermosetting. For example, it is formed of a material having a single-layer structure. In the case where the adhesive is a coating material, the coating material is applied in a semi-hardened state.

Figure 7:
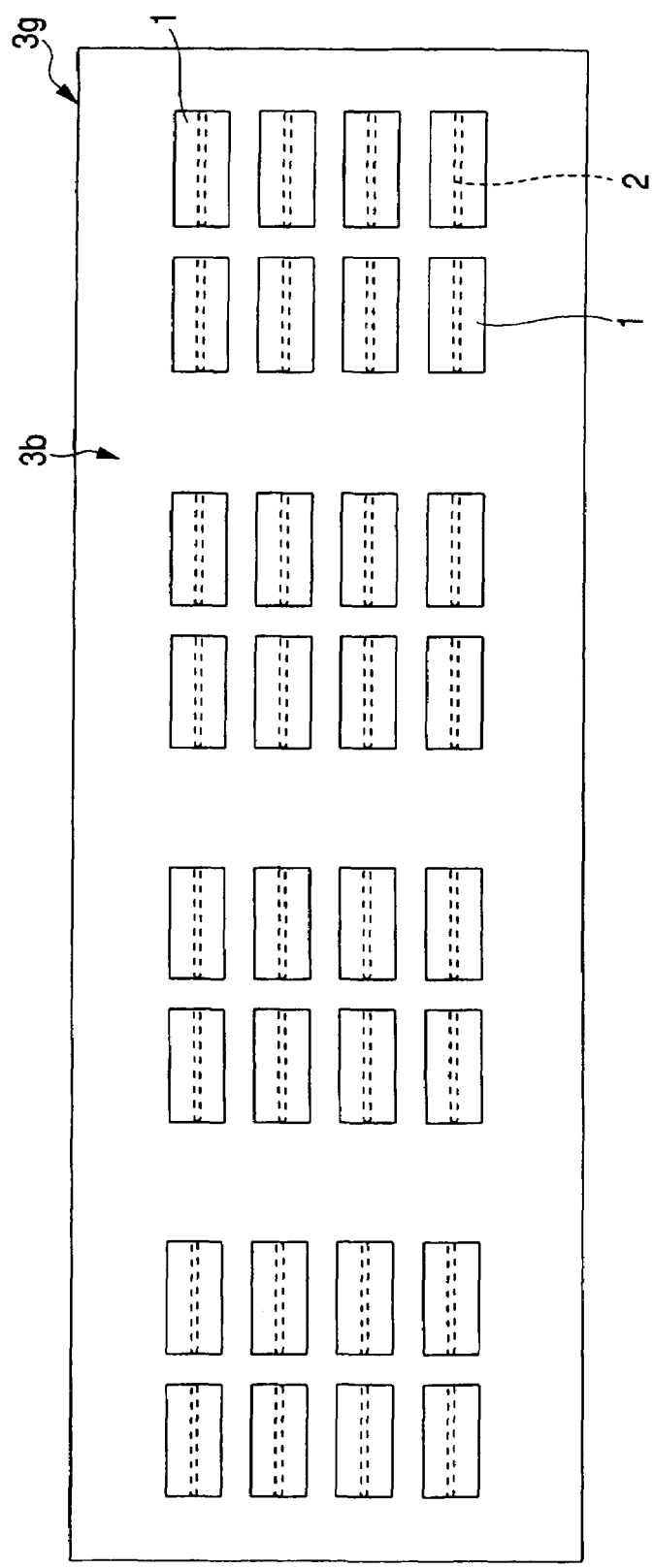
FIG. 7 is a plan view showing an example of the structure on the back surface side of the wiring substrate after die bonding in the assembling procedure illustrated in FIG. 4.

Thereafter, as shown in step S2 in FIG. 4, and also shown in FIG. 7, die bonding is performed to bond semiconductor chips 1 through die bonding tapes 2, respectively, to device areas 3h formed on the back surface 3b of the matrix substrate 3g. At this time, both are bonded together in such a manner that the main surface 1b of each semiconductor chip 1 is bonded to the die bonding tapes 2, and the pads 1a in the semiconductor chip 1 are positioned within the aperture 3e formed in each device area 3h on the matrix substrate 3g.

Subsequently, wire bonding is performed in step S3. More specifically, as shown in FIG. 3, the pads 1a in each semiconductor chip 1 and bonding electrodes 3c (see FIG. 1) in the corresponding device area 3h on the matrix substrate 3g are connected together through wires 4.

Thereafter, resin molding is performed in step S4. In this step, the plural device areas 3h on the matrix substrate 3g are subjected all together to resin molding.

Subsequently, balls are mounted in step S5. In this step, solder balls 5 serving as external terminals are mounted respectively on bump lands 3f in each device area 3h on the matrix substrate 3g.

Thereafter, in step S6, dicing is performed to divide the substrate into individual packages. More specifically, the matrix substrate 3g and the sealing member 6 are diced into individual device areas 3h. In this way, assembling of the BOC 7 is completed.

Next, in connection with a method of fabricating the semiconductor integrated circuit device (BOC 7) embodying the present invention, a detailed description will be given below about the die bonding used in the assembling of the BOC 7.

Reference will first be made to the main construction of a chip mounter (semiconductor fabricating apparatus) 8 used in the die bonding (chip mounting) step.

Figure 8:
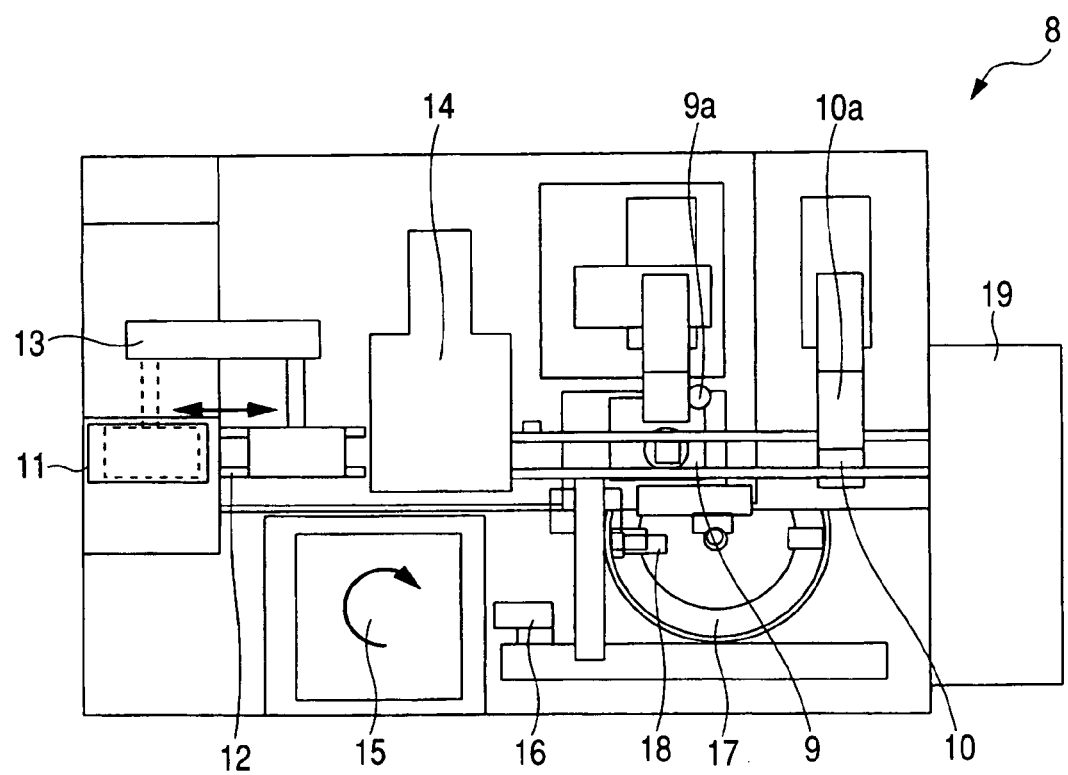
FIG. 8 is a diagrammatic plan view showing an example of the structure of a semiconductor device fabricating apparatus embodying the present invention.

The chip mounter 8 shown in FIG. 8 comprises a first compression bonding unit 9 for compression-bonding the matrix substrate 3g and the semiconductor chips 1 to each other temporarily (temporary bonding), a second compression bonding unit 10 for main compression bonding (main bonding) after the temporary bonding, a stocker 11 for storage of the matrix substrate 3g before compression bonding of the chips, a handler 13 for taking out the matrix substrate 3g from the stocker 11 and placing it on guide rails 12, a prebaking unit 14 for prebaking the matrix substrate 3g, a load port 15 for storing a diced semiconductor wafer, a transfer robot 16 for taking out the semiconductor wafer from the load port 15 and transferring it onto a wafer stage 17, a pickup unit 18 for picking up the semiconductor chips 1 from the semiconductor wafer positioned on the wafer stage 17 and conveying them to the first compression bonding unit 9, and a product unloader 19 for storing the matrix substrate 3g after the main compression bonding of the semiconductor chips 1.

Figure 9:
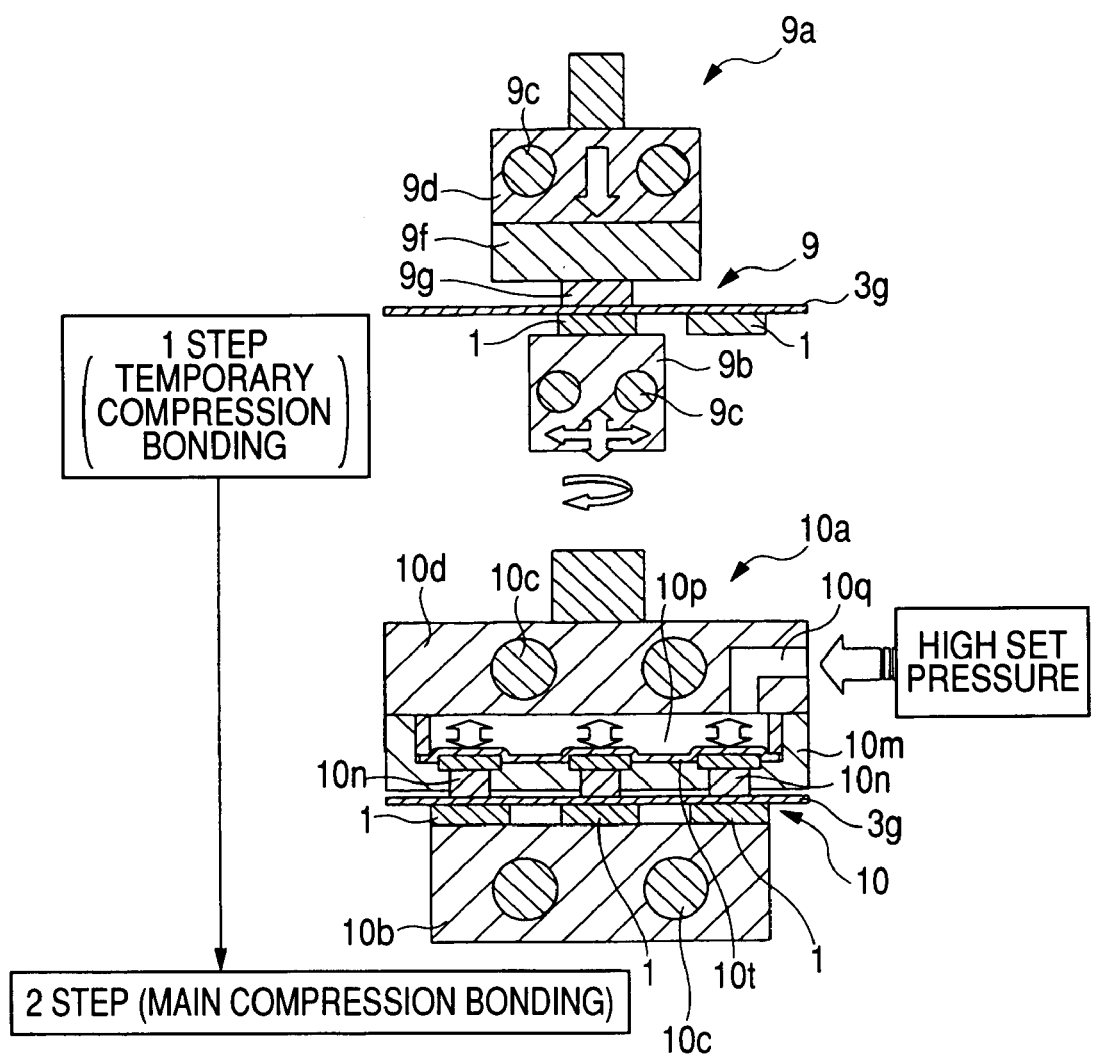
FIG. 9 is a sectional view showing a structural example of principal portions of the semiconductor device fabricating apparatus illustrated in FIG. 8.
Figure 10:
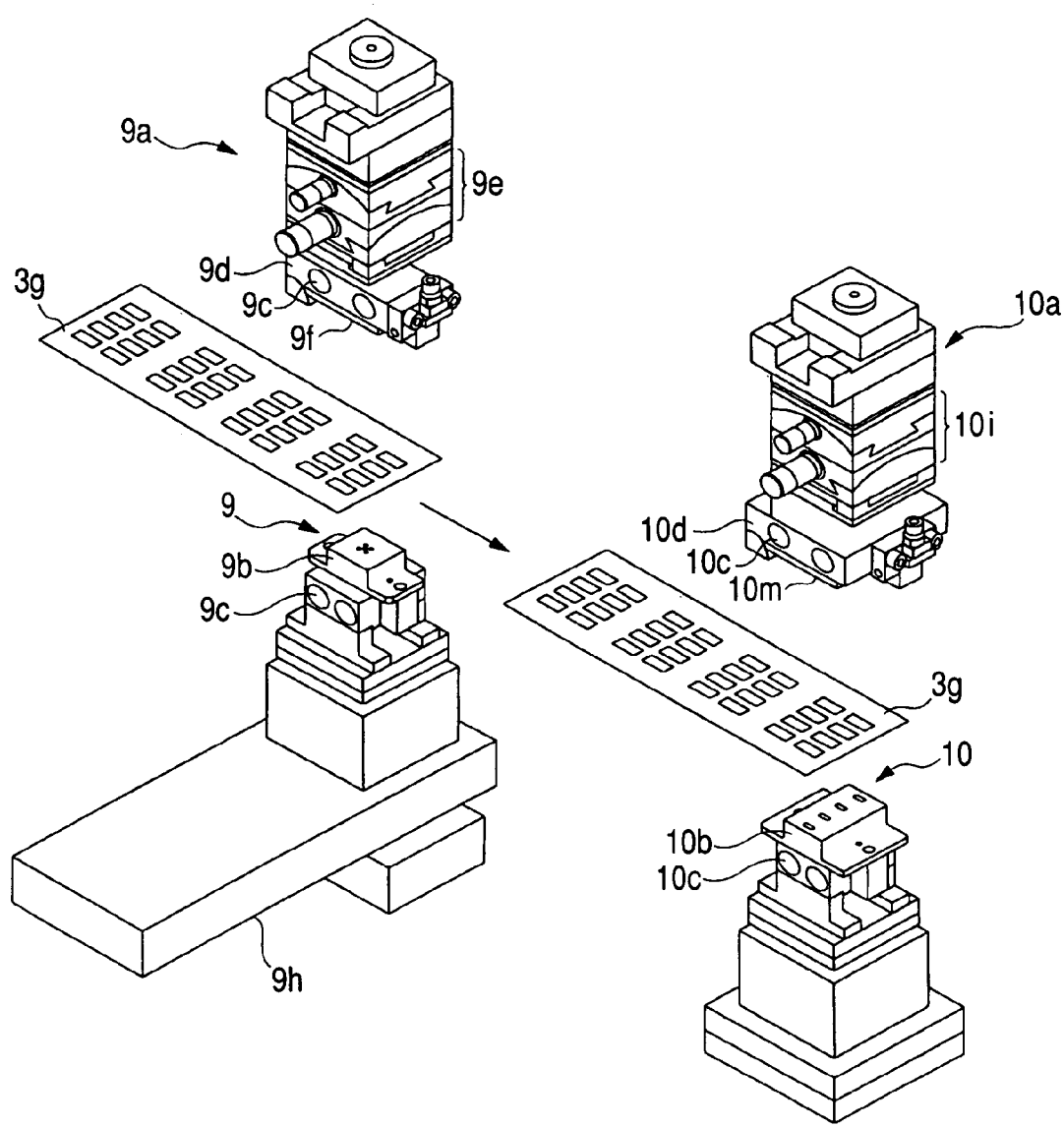
FIG. 10 is a perspective view showing a structural example of principal portions of the semiconductor device fabricating apparatus illustrated in FIG. 8.

As shown in FIGS. 9 and 10, a first head 9a for the application of pressure and a heating stage (first stage) 9b capable of carrying the semiconductor chips 1 thereon are provided in the first compression bonding unit 9, with a heater 9c operating as heating means being incorporated in each of the first head 9a and the first heating stage 9b. The first head 9a is provided at a front end thereof with a support block portion 9f having a pressure block 9g. The support block portion 9f is attached to a block body portion 9d, which in turn is connected to an inclination adjusting mechanism 9e. The first heating stage 9b is mounted to an XY stage 9h.

In the first compression bonding unit 9, as shown in FIG. 9, positioning of the semiconductor chips 1 and temporary compression bonding between the semiconductor chips 1 and the matrix substrate 3g are carried out as a first step. The temporary bonding involves bonding to such an extent that the semiconductor chips 1 do not peel. In the first compression bonding unit 9, the chips are subjected to thermocompression bonding one by one by the first head 9a.

In the thermocompression bonding, the semiconductor chips 1 are heated directly by the first heating stage 9b without interposition of the matrix substrate 3g; and, at the same time, the bonding portions between the semiconductor chips 1 and the matrix substrate 3g are heated through the matrix substrate 3g by the heater 9c incorporated in the block body portion 9d, which is disposed above the matrix substrate 3g. The pressurizing time for one semiconductor chip 1 in the first compression bonding unit 9 is, for example, 0.1 second or so.

On the other hand, in the second compression bonding unit 10, a second head 10a for the application of pressure and a second heating stage (second stage) 10b capable of carrying the semiconductor chips 1 thereon are provided, and a heater 10c operating as heating means is incorporated in each of the second head 10a and the second heating stage 10b. The second head 10a is provided at a front end thereof with a support block portion 10m having plural pressure blocks 10n. The support block portion 10m is attached removably to a block body portion (body portion) 10d, which in turn is connected to an inclination adjusting mechanism 10i.

The plural pressure blocks 10n are disposed in a space 10p which is defined in the interior by the support block portion 10m and the block body portion 10d. In the space 10p, the pressure blocks 10n are supported within the support block portion 10m in a state in which they are pressed by a single sheet-like elastic film 10t so as to be independently movable in the vertical direction.

An air supply system 10q, providing a passage of air to be fed to the space 10p, is formed in the block body portion 10d.

In the second compression bonding unit 10, the semiconductor chips 1, having been compression-bonded temporarily in the first compression bonding unit 9, are subjected to a main compression bonding for the matrix substrate 3 as a second step, as shown in FIG. 9. In the main compression bonding, a high pressure is fed to the space 10p from the air supply system 10q in the block body portion 10d to pressurize each pressure block 10n at a desired preset load, and, at the same time, the semiconductor chips are heated directly by the second heating stage 10b.

More specifically, in the second compression bonding unit 10, plural (for example, three in FIG. 9) semiconductor chips 1 are heated and pressurized at one time (simultaneously). The pressurizing time for one semiconductor chip 1 in the second compression bonding unit 10 is, for example, 4 seconds or so and is thus much longer than in the first compression bonding unit 9.

Figure 11:
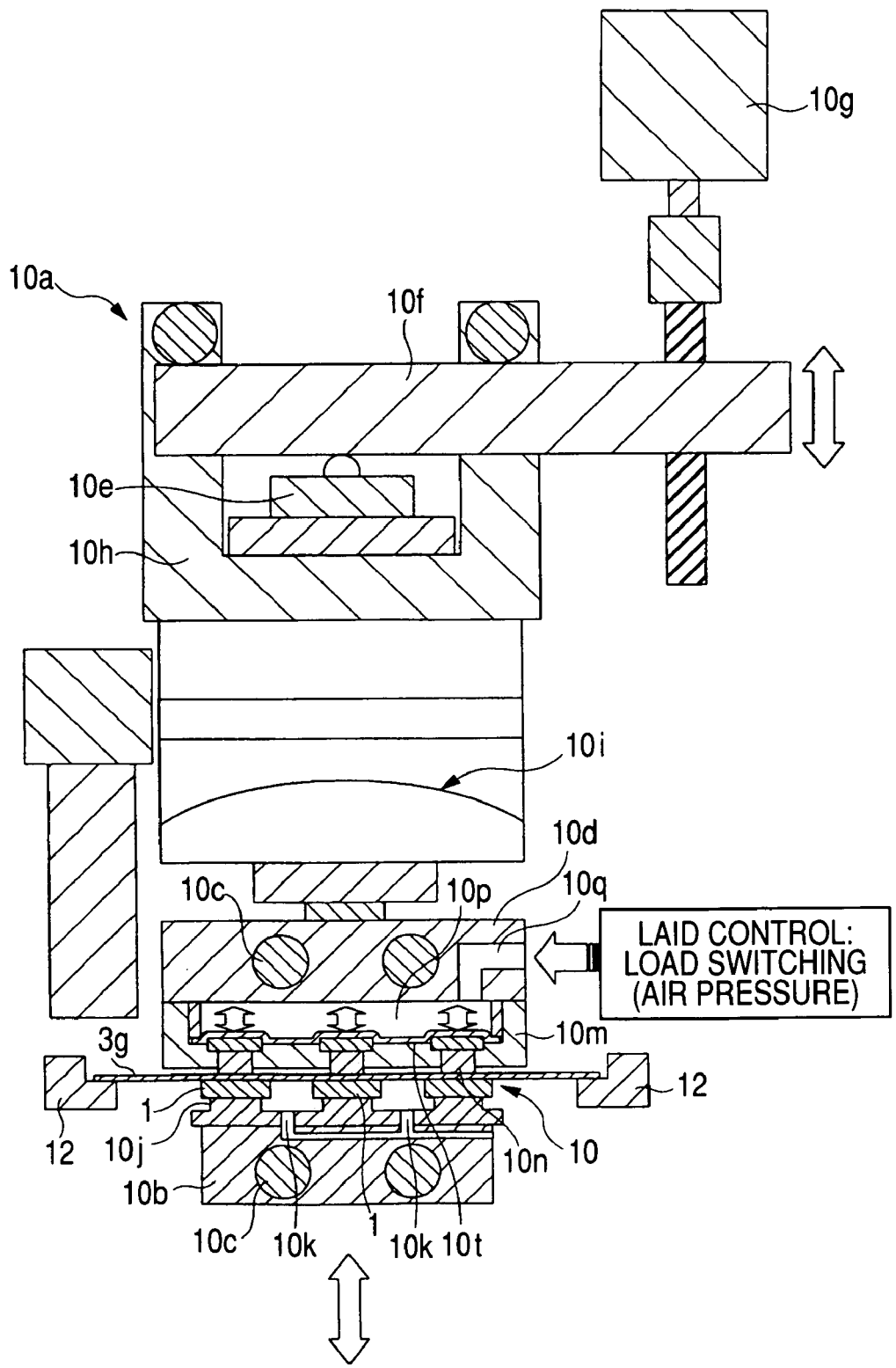
FIG. 11 is a sectional view showing a structural example of a second heating stage-side principal portion of the principal portions illustrated in FIG. 10.

As shown in FIG. 11, a load cell 10e operating as a load change detecting means is incorporated in the second head 10a to detect the total load imposed on each semiconductor chip in actual thermocompression bonding and the landing height of the head tip (the front end portion of each pressure block 10n).

The load cell 10e is disposed on a load cell support portion 10h and is supported in a sandwiched state between the load cell support portion 10h and a height control plate 10f. According to this structure, the weight of the front end-side block beyond the load cell 10e can be cancelled. The height control plate 10f can control the height with use of a servo-motor 10g. The load cell support portion 10h is connected to the block body portion 10d through the inclination adjusting mechanism 10i which is used for adjusting the inclination of the block body portion 10d.

The height of the second heating stage 10b can also be servo-controlled.

In the second head 10a, the load control can be carried out by using only the front-end pressure of the head. More particularly, the load imposed on the plural pressure blocks 10n can be switched from one to another value by controlling the amount of air fed into the space 10p from the air supply system 10q in the block body portion 10d.

With such a load control, at the time of thermocompression bonding in the second compression bonding unit 10, the plural pressure blocks 10n can be made to land at a low load relative to the products, as shown in FIG. 12A at stages A to D.

More specifically, the matrix substrate 3g after temporary compression bonding of the semiconductor chips 1 on the first heating stage 9b in the first compression bonding unit 9 is then disposed on the second heating stage 10b in the second compression bonding unit 10 which is adjacent to the first compression bonding unit 9. At this time, the semiconductor chips 1 are disposed on the lower side of the matrix substrate 3g, i.e., on the second heating stage 10b side, and air at a low pressure (first pressure) is fed into the space 10p from the air supply system 10q in the block body portion 10d and is applied to the plural pressure blocks 10n (FIG. 12 at A).

In this state, the second heating stage 10b is raised, allowing plural semiconductor chips 1 to be placed on the second heating stage 10b (FIG. 12 at B). Since the heater 10c is incorporated in the second heating stage 10b, the plural semiconductor chips 1 are heated directly by the second heating stage 10b.

Thereafter, the second head 10a is moved down, whereby the plural pressure blocks 10n each supported for independent movement by the support blocks portion 10m are brought into contact with the matrix substrate 3g (FIG. 12 at C).

After the matrix substrate 3g and the plural semiconductor chips 1 have been sandwiched in between the second heating stage 10b and the plural pressure blocks 10n, air of a higher pressure (second pressure) than the foregoing low pressure (first pressure) is fed into the space 10p from the air supply system 10q in the block body portion 10d and is applied to the pressure blocks 10n (FIG. 12 at D).

In this case, after all the pressure blocks 10n have landed at a small load onto the matrix substrate 3g, variations in height of the pressure blocks 10n are absorbed by the elastic film 10t and, in this state, switching to the high pressure is effected.

In this state, on the second heating stage 10b in the second compression bonding unit, a main compression bonding is carried out as thermocompression bonding between the matrix substrate 3g and the plural semiconductor chips 1, while heating the plural semiconductor chips 1 by use of the second heating stage 10b.

That is, at the time of carrying out the main compression bonding in the second head 10a according to this embodiment, a low load is applied to the matrix substrate 3g until contact of the plural pressure blocks 10n with the products. Then, after the contact, switching is to the high pressure is carried out and the original set pressure is applied to both matrix substrate 3g and the semiconductor chips 1. By so doing, at the time of landing of the head in the main compression bonding, products can be prevented from being shocked and damaged by the pressure blocks 10n.

The semiconductor chips 1 are pressurized by the second head 10a in the second compression bonding unit 10 for a longer time than the pressurizing time in the first heating stage 9b. For example, the pressuring time in the first heating stage 9b is about 0.1 second, while the pressurizing time in the second heating stage is about 4 seconds. Since the semiconductor chips 1 can thus be pressurized for a relatively long time in the second heating stage 10b, the product heating time can be set relatively low in comparison with that in the conventional die bonding method.

FIG. 13 illustrates a modification of the chip mounting method shown in FIG. 12. In FIG. 13, the matrix substrate 3g and the semiconductor chips 1, which have been compression-bonded temporarily in the first heating stage 9b, are disposed on the second heating stage 10b (FIG. 13 at A), and then the second head 10a is moved down, causing the plural pressure blocks 10n to come into contact with the matrix substrate 3g (FIG. 13 at B). Thereafter, the second heating stage 10b is raised, whereby the matrix substrate 3g and the semiconductor chips 1 are sandwiched in between the pressure blocks 10n and the second heating stage 10b (FIG. 13 at C). These operations are performed at a low pressure as is the case with the chip mounting method shown in FIG. 12.

Thereafter, in the same manner as in the chip mounting method shown in FIG. 12, air of a higher pressure (second pressure) than the above-mentioned low pressure (first pressure) is fed into the space 10p from the air supply system 10q in the block body portion 10d and is applied to the plural pressure blocks 10n. In this state, a main compression bonding is performed (FIG. 13 at D).

When the main compression bonding is to be performed in the second compression bonding unit 10, the semiconductor chips 1 disposed on the lower side of the matrix substrate 3g are heated directly from their back surfaces (second main surfaces) 1c on the second heating stage 10b without interposition of the substrate; and, at the same time, the matrix substrate 3g is heated through the support block portion 10m and pressure blocks 10n by means of the heater 10c incorporated in the block body portion 10d which is disposed above. In this way the matrix substrate 3g and the bonding portions of the semiconductor chips 1 are thermocompression-bonded to each other while being heated from both upper and lower sides.

That is, the semiconductor chips 1 are heated from the second heating stage 10b side, while the matrix substrate 3g is heated from the side opposite to the second heating stage 10b with respect to the matrix substrate, to effect thermocompression bonding.

At this time, the semiconductor chip side is heated at a higher temperature than on the substrate side. For example, since the semiconductor chip 1 is formed of silicon and is relatively high in thermal conductivity, the semiconductor chip side is heated at a temperature of about 200° C. On the other hand, the matrix substrate 3g is mainly formed of an insulating material, and so it is poor in thermal conductivity and is apt to cause thermal deformation and breaking of the wire. Therefore, for the matrix substrate 3g side, there is set as low a temperature as possible, e.g., 150° C. or lower, 100° C. or lower, if possible, preferably 50° C. or lower, most suitably a normal temperature.

Reference will now be made to a structural example of the matrix substrate 3g (organic substrate 3). An organic resin serving as a base which constitutes a principal portion of the matrix substrate is made, for example, of BT resin (bismaleimide triazine resin) and wiring copper layers are formed respectively on both the top surface and back surface of the organic resin base. Further, a solder resist film, which is an organic insulating film (organic layer), is formed on the surface of a predetermined area in each of the wiring layers. Thus, the matrix substrate 3g (organic substrate 3) is a multi-layer wiring substrate having two wiring layers.

The glass transition temperature (Tg) of the BT resin is, for example, 240° to 330° C. In this case, therefore, the heating temperature (200° C.) from the back surface 1c side of the semiconductor chips 1 on the second heating stage 10b is lower than the glass transition temperature (240° to 330° C.) of the BT resin, and, thus, it is possible to prevent the occurrence of an inconvenience caused by heat, such as thermal deformation of the substrate.

The modulus of rigidity of the solder resist film is lower than that of BT resin as the organic resin base, and thus the bonding between the semiconductor chips 1 and the matrix substrate 3g (organic substrate 3) is performed through the solder resist film, which is an organic layer lower in rigidity modulus than BT resin. Consequently, it is possible to enhance the adhesion between the semiconductor chips 1 and the substrate.

The structure of the matrix substrate 3g is not limited to the above-described structure. For example, it may be a multi-layer wiring substrate having two or more wiring layers. The organic resin base which constitutes the foregoing principal portion of the substrate may be any other resin than BT resin.

Further, the bonding between the semiconductor chips 1 and the adhesive, such as the die bonding tapes 2, is a bonding between surfaces, i.e., main surfaces 1b of the semiconductor chips 1, and the adhesive. For example, when a protective film is formed on the surface of each semiconductor chip 1, the protective film and the adhesive are bonded, i.e., thermocompression-bonded, to each other.

Figure 14:
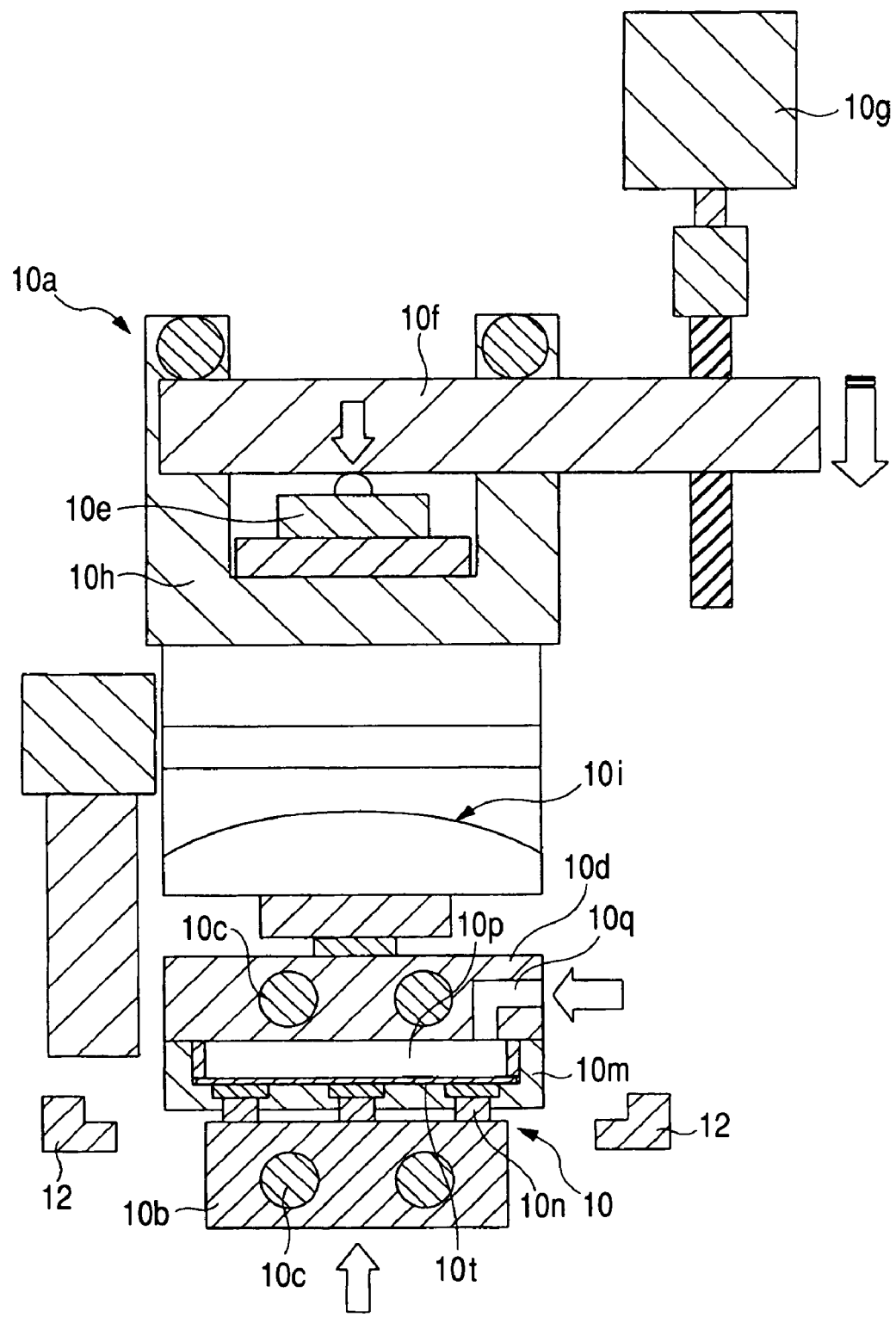
FIG. 14 is a sectional view showing a structural example in landing detection of the principal portion illustrated in FIG. 11.

FIG. 14 illustrates the detecting of landing of the front end of the second head 10a relative to the pressure blocks 10n. For detecting the landing referred to, first, with products not placed on the second heating stage 10b, a high pressure, which is high to such an extent as to not push up the pressure blocks 10n, is applied from the air supply system 10q in the block body portion 10d to the plural pressure blocks 10n, each of which are supported for independent movement by the support block portion 10m. That is, a high pressure is applied to the pressure blocks 10n in such a manner that the pressure blocks 10n are not forced up at an ordinary load.

In this state, the second heating stage 10b is raised into contact with the plural pressure blocks 10n. Further, the motor 10g is turned ON to let the control plate 10f move down. In this case, the position at which the load cell 10e indicates a change corresponds to an initial height of the pressure blocks 10n. According to this method, it is possible to determine the landing height of the pressure blocks 10n.

Further, with products placed on the second heating stage 10b, the pressure to be applied to the pressure blocks 10n is raised gradually from a low level and a point of change of the load imposed on the load cell 10e is detected, whereby the magnitude of pressure imposed on plural semiconductor chips 1 can be determined. That is, while the semiconductor chips 1 are actually subjected to the main compression bonding, it is possible to determine the magnitude of pressure imposed on the semiconductor chips.

Figure 15:
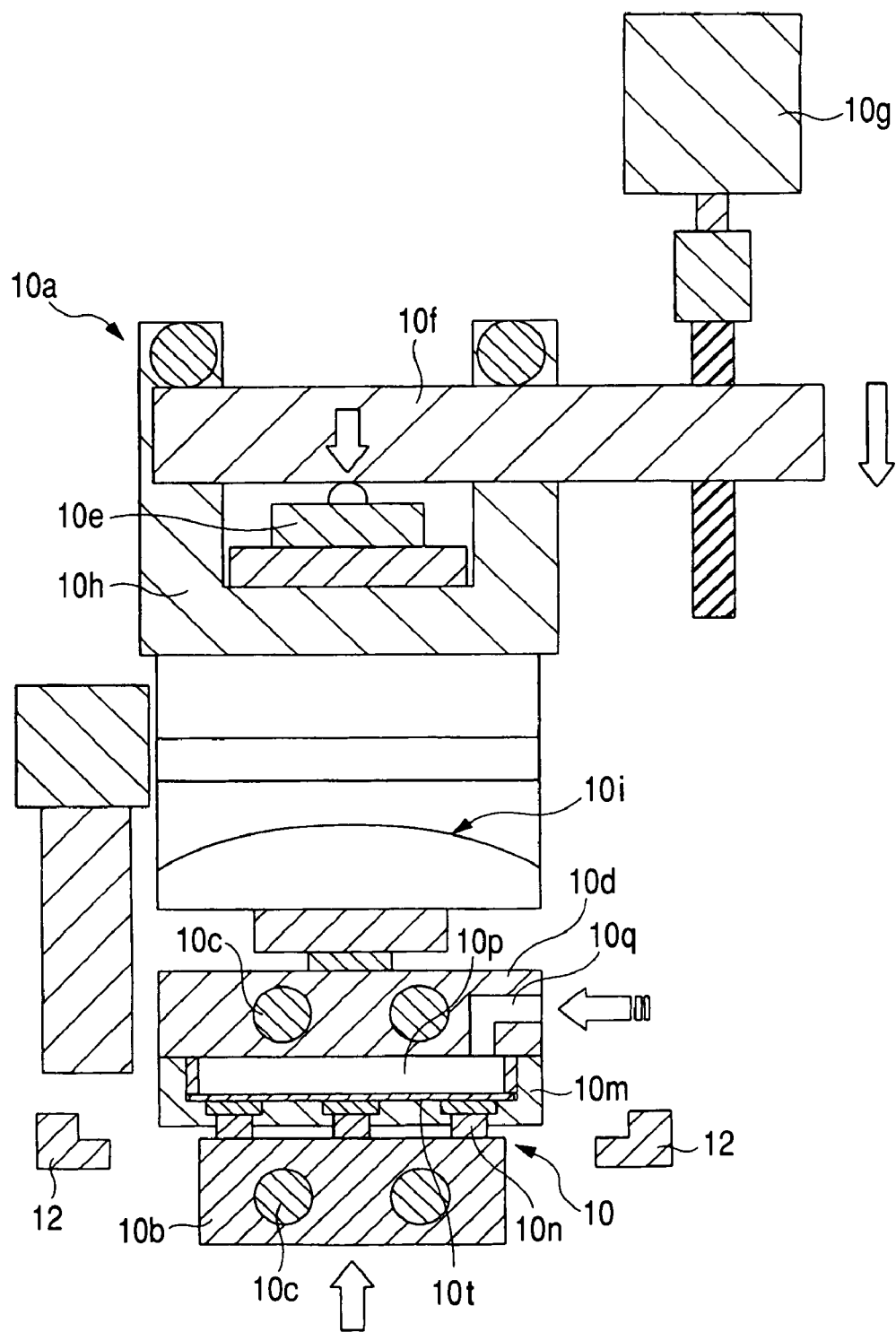
FIG. 15 is a sectional view showing a structural example in load setting of the principal portion illustrated in FIG. 11.

FIG. 15 illustrates the detecting of a set load.

More specifically, with products not placed on the second heating stage 10b, first the second heating stage 10b is raised while applying a low pressure to the pressure blocks 10n, causing the pressure blocks 10n and the second heating stage 10b to come into contact with each other. That is, the pressure blocks 10n are kept in a landed state with a low pressure. In this state, the height control plate 10f is moved down a predetermined certain distance by operating the motor 10g to push in the load cell 10e.

Thereafter, the pressure applied to the plural pressure blocks 10n is raised gradually and a point of change of the load imposed on the load cell 10e is detected, whereby it is possible to determine the magnitude of a set value of pressure which is imposed on the plural pressure blocks 10n at the time of performing the thermocompression bonding (main compression bonding) with the semiconductor chips 1 disposed on the second heating stage 10b.

In this way, with the chip mounter 8 alone, it is possible to detect the magnitude of a set load at the time of thermocompression-bonding plural semiconductor chips 1 at one time.

After detection of the set load upon arrival at the load, the set air pressure is stored in the chip mounter 8.

Figure 16:
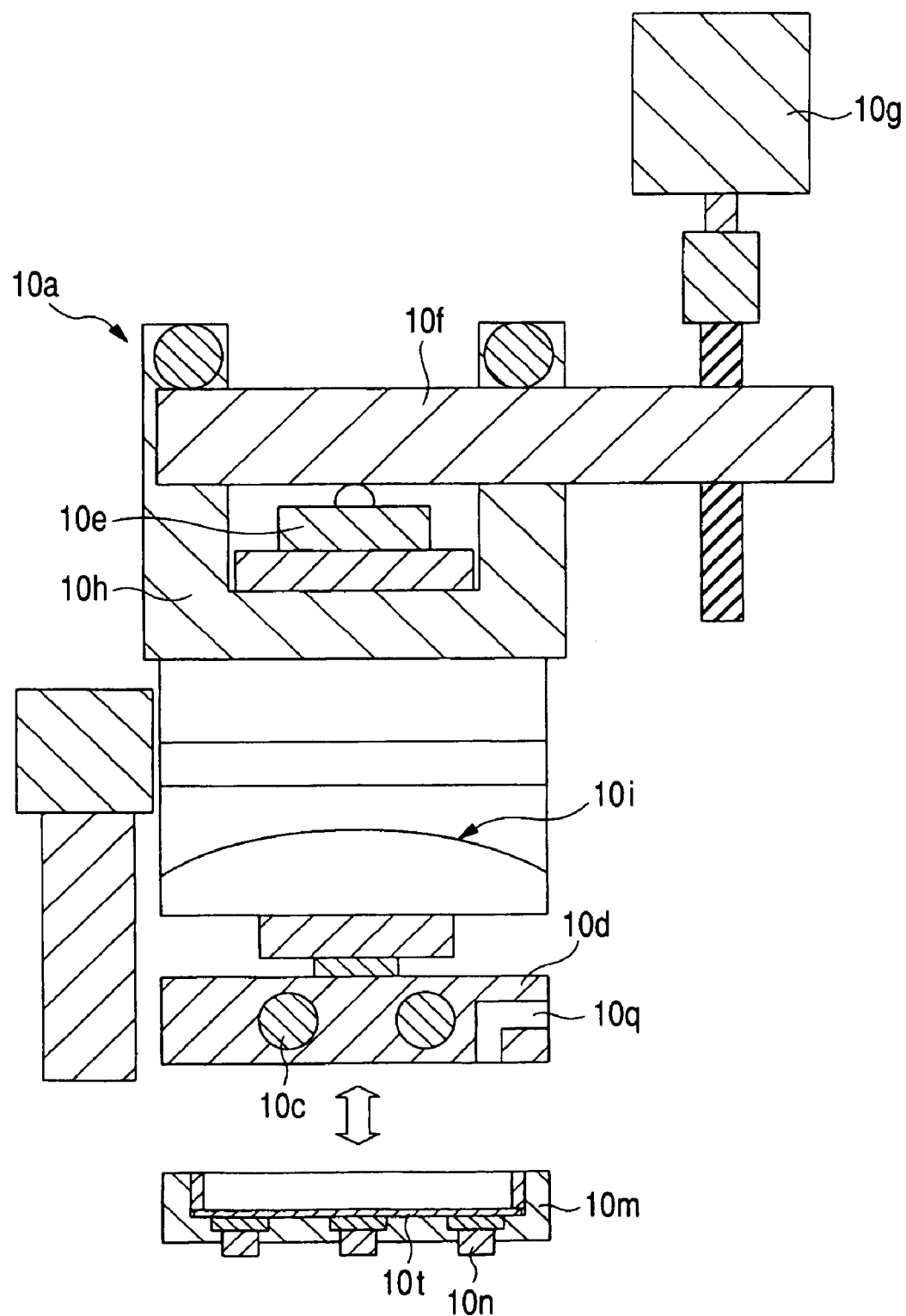
FIG. 16 is a sectional view showing a structural example in type switching of the principal portion illustrated in FIG. 11.

FIG. 16 illustrates a tool changing method.

In the chip mounter 8 according to this embodiment, in the second head 10a, the support block portion 10m (also called a tool) which supports the pressure blocks 10n is mounted to the block body portion 10d removably, and by removing and replacing only the support block portion 10m (only the tool), it is possible to easily cope with a change of type, e.g., a change in the number of semiconductor chips 1, the chip size or the load.

Figure 17:
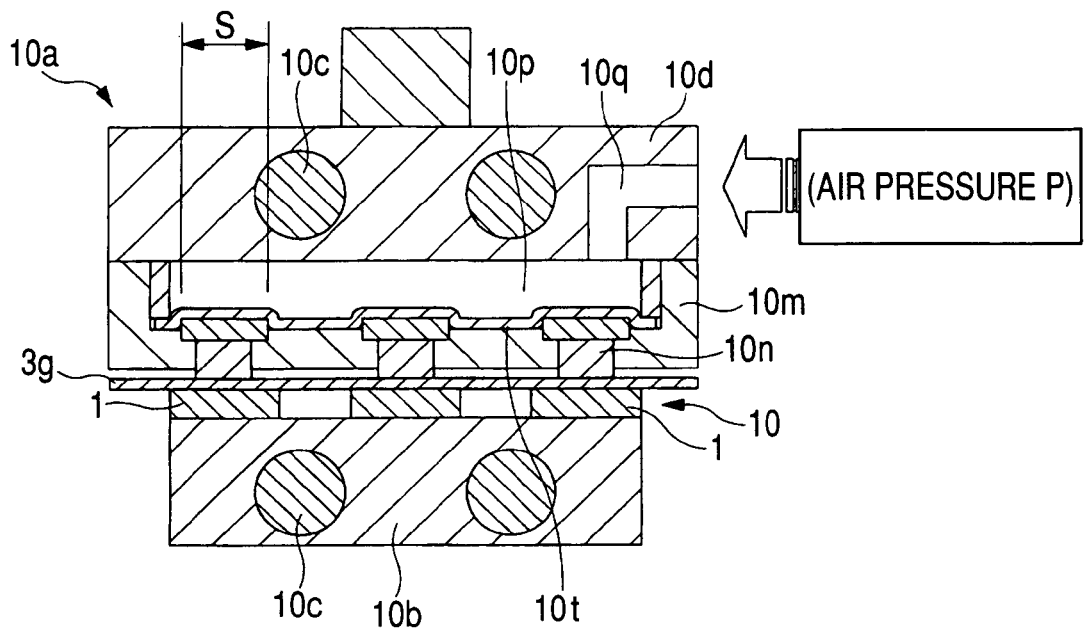
FIG. 17 is a sectional view showing an example of a closely contacted state of an elastic member in the principal portion illustrated in FIG. 11.

FIG. 17 shows the magnitude of a load imposed on each pressure block 10n and how to absorb variations in height of the pressure blocks 10n. The magnitude of a load imposed on each pressure block 10n is equal to the air pressure P× the pressure receiving area S. At a low pressure, the elastic film 10t is deformed so as to follow the head shape of the pressure blocks 10n so as to absorb any error in height of each pressure block 10n, followed by adjustment to the set pressure. As a result, it is possible to absorb variations in height of the pressure blocks 10n.

Figure 18:
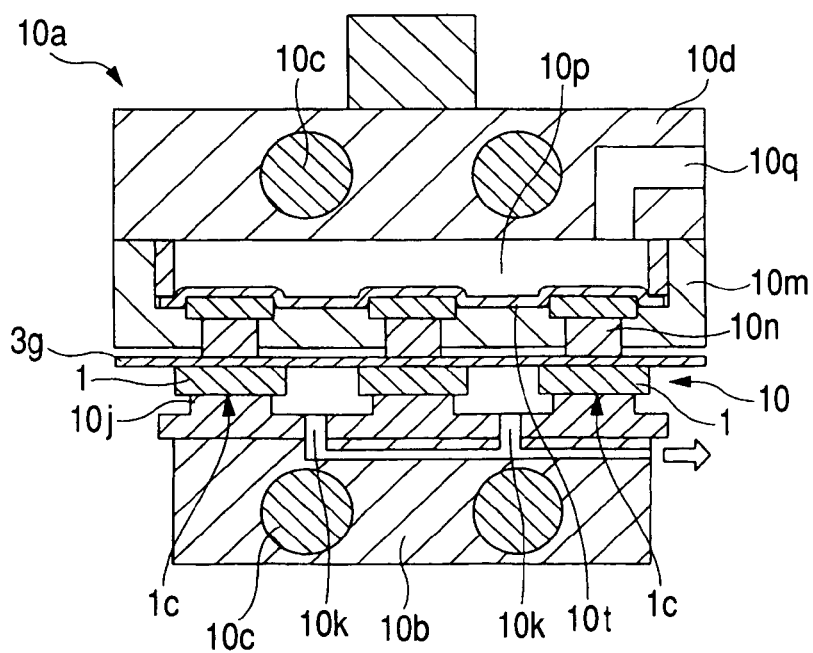
FIG. 18 is a sectional view showing an example of a dust particle sucking state in the principal portion illustrated in FIG. 11.

FIG. 18 shows how to prevent the generation of silicon waste (dust particles) in the second heating stage 10b and how to prevent inclusion of the waste.

On the surface of the second heating stage 10b there are plural small-sized stages 10j which are each smaller than the back surface (second main surface) 1c of each semiconductor chip 1. With such small-sized stages 10j, when each semiconductor chip 1 is placed on each small-sized stage 10j, end portions of the back surface 1c of the semiconductor chip 1 do not contact the small-sized stage 10j, nor do they contact chipping start positions by dicing of the semiconductor chip 1. Consequently, it is possible to prevent the generation of silicon waste.

In the second heating stage 10b there are plural suction systems 10k which are open to the chip-side face. Dust particles, such as silicon waste that has fallen off onto the chip-side face during the main thermocompression bonding of the semiconductor chips 1 and the matrix substrate 3g, can be sucked in and removed through the suction systems 10k.

Thus, even in the event of generation of dust particles, such as silicon waste, they can be removed through the suction systems 10k, so that it is possible to prevent the inclusion of dust particles between the semiconductor chips 1 and the stage.

Figure 19:
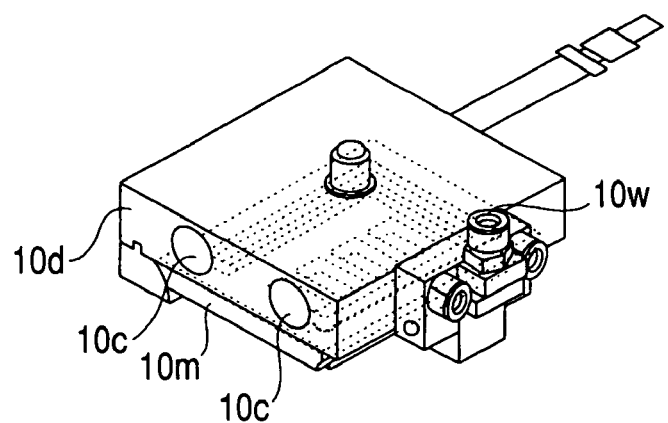
FIG. 19 is a perspective view showing a structural example in a mounted state of a support block portion in the principal portion illustrated in FIG. 11.
Figure 20:
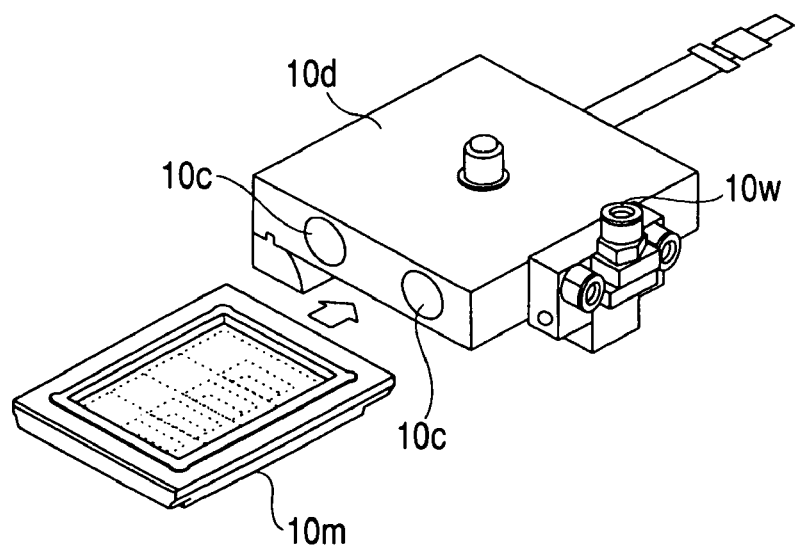
FIG. 20 is a perspective view showing an example of a method for mounting the support block portion illustrated in FIG. 19.

FIG. 19 shows the appearance of the structure of the support block portion 10m when mounted to the block body portion 10d. As shown in FIG. 20, the support block portion 10m is brought into sliding fit in the lower portion of the block body portion 10d and is fixed using a fixing screw 10w.

Figure 21:
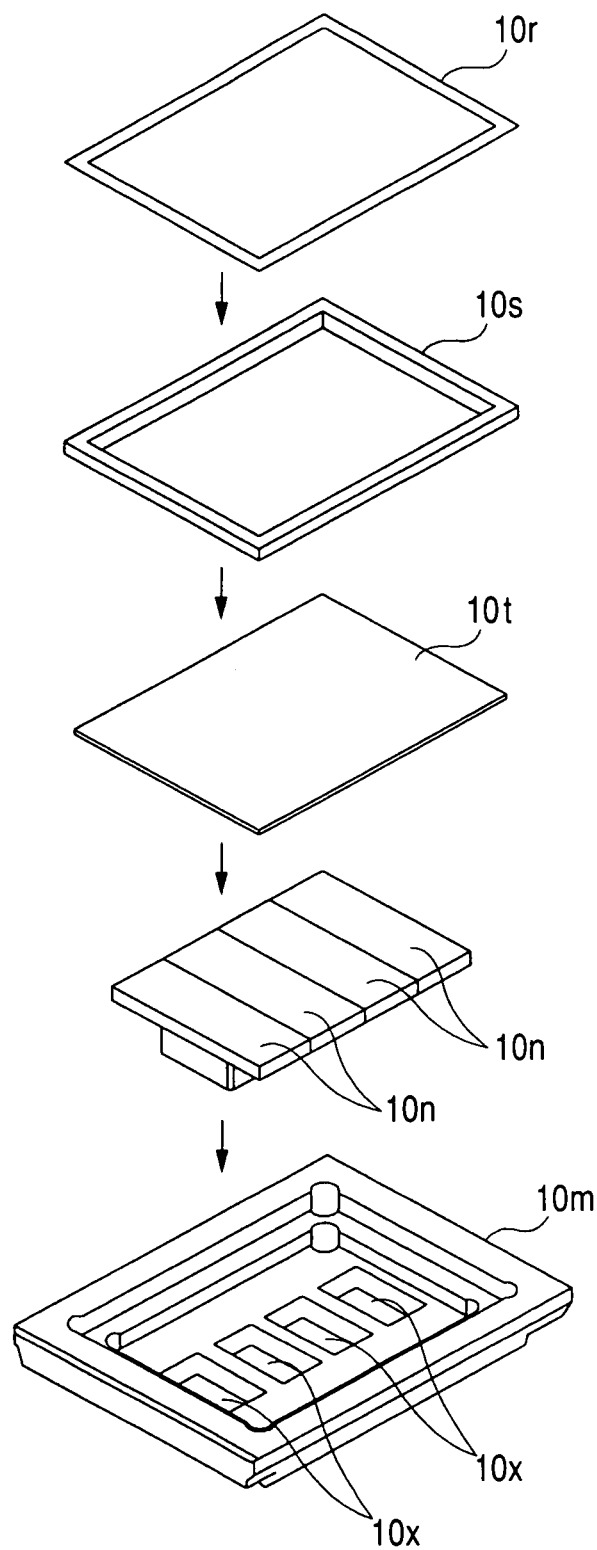
FIG. 21 is a developed perspective view showing a structural example of internal parts of the support block portion illustrated in FIG. 20.
Figure 22:
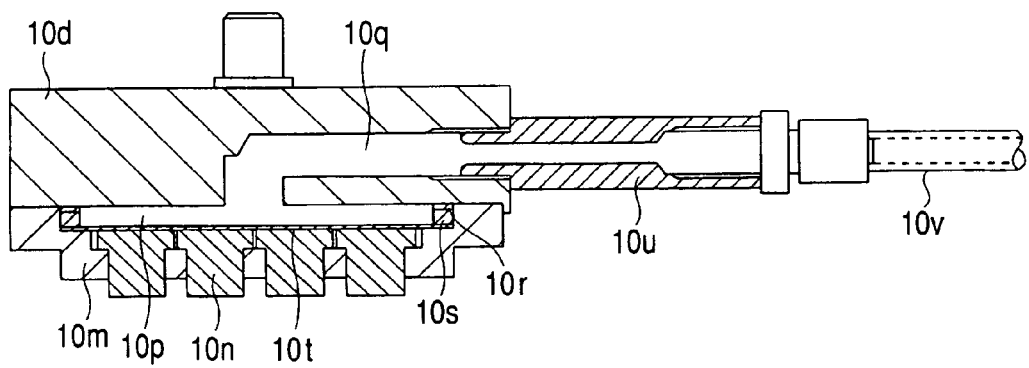
FIG. 22 is a sectional view showing a structural example of the support block portion illustrated in FIG. 20.

As shown in FIG. 21, the support block portion 10m is formed in a recessed shape, and through holes 10x in a number corresponding to the number of the pressure blocks 10n are formed in the bottom of the support block portion 10m. As shown in FIG. 22, each pressure block 10n has a projection shape and functions as a plunger. The projection portions of the pressure blocks 10n are positioned respectively in the through holes 10x formed in the bottom of the support block portion 10m. According to this arrangement, front end portions of the pressure blocks 10n slightly project downward from the support block portion 10m.

Within the support block portion 10m, as shown in FIG. 21, a sheet-like elastic film 10t is disposed on the pressure blocks 10n; then, a frame-like elastic spacer 10s is disposed on the elastic film 10t; and, further, a frame-like metallic spacer 10r is disposed at the top stage.

As shown in FIG. 22, the support block portion 10m is mounted to the block body portion 10d in a removable manner.

The frame-like elastic spacer 10s is formed of a fluorine-based rubber, for example, and it seals the space 10p hermetically to prevent the leakage of vacuum. Further, with the elastic force of the elastic spacer 10s, it is possible to stabilize the load at peripheral edge portions of the plural pressure blocks 10n.

The metallic spacer 10r is formed of stainless steel, for example, and it functions to prevent galling and sticking as close contact of the elastic spacer 10s to the block body portion 10d, thereby facilitating mounting and removal of the support block portion 10m to and from the block body portion 10d. That is, the support block portion 10m is removably mounted relative to the block body portion 10d through the metallic spacer 10r.

The elastic film 10t is a sheet-like member formed of a fluorine-based rubber, for example, having a thickness of about 0.5 mm. When air pressure is applied to the space 10p, the elastic film 10t pressurizes the head portions of the pressure blocks 10n simultaneously. Since the elastic film 10t is very thin, it can move so as to follow vertical movements of each individual pressure block 10n.

As shown in FIG. 22, an air supply system 10q communicating with the space 10p is formed in the block body portion 10d to which the support block portion 10m is attached, and a relay pipe (air introducing portion) 10u for introducing air into the air supply system 10q is attached to the block body portion 10d. A hose 10v is connected to the relay pipe 10u and air under pressure is fed to the air supply system 10q through the hose 10v and further through the relay pipe 10u.

Thus, it is preferable that the relay pipe 10u be long to such an extent that is does not conduct heat to the hose 10v. If the relay pipe 10u is short, heat is conducted to the hose 10v, with consequent expansion of the hose 10v and a change in the amount of air. Therefore, it is preferable to make the relay pipe 10u long so as not to cause a change in the amount of air being fed and to enhance the heat resistance of the pipe.

Figure 23:
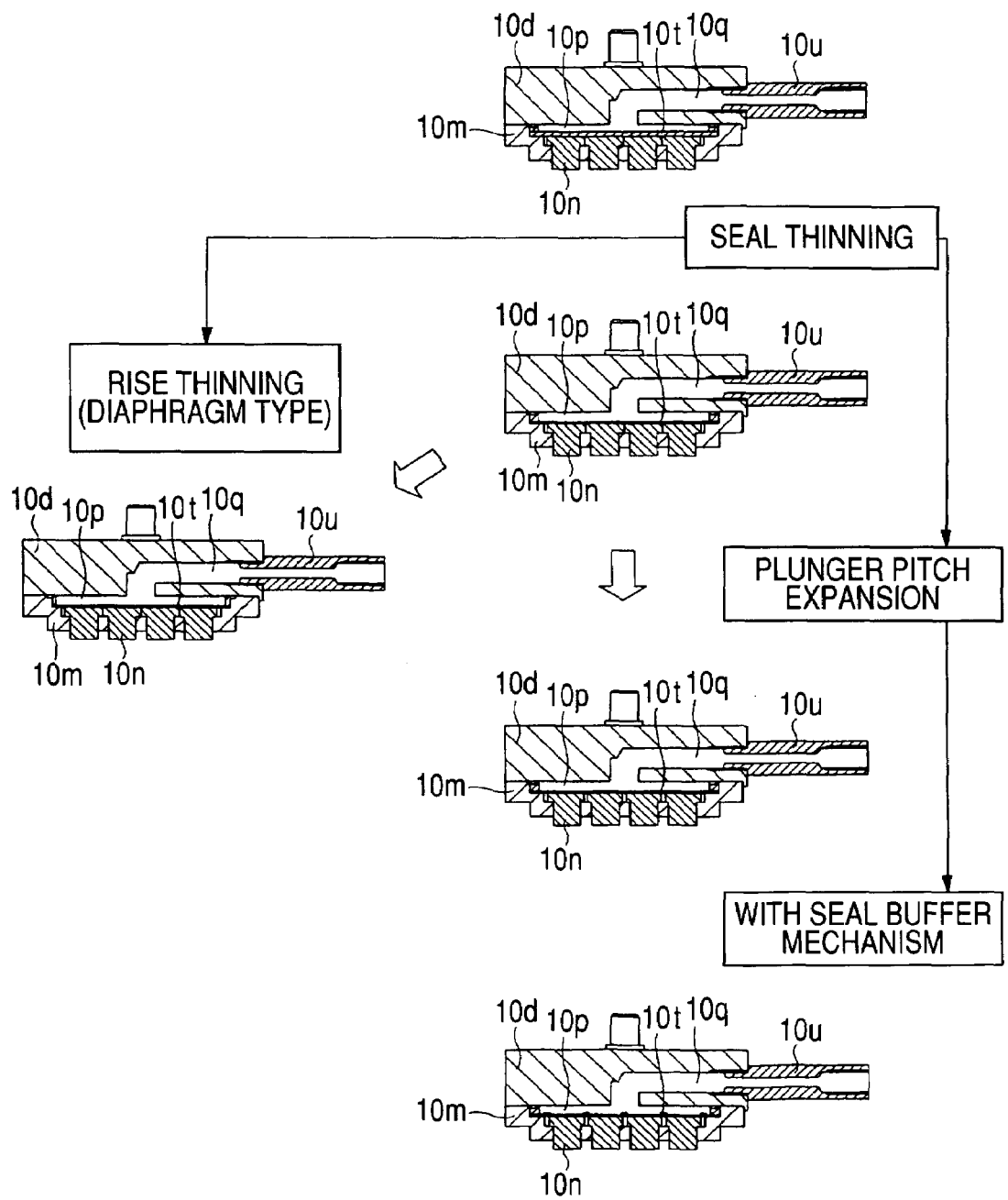
FIG. 23 is a sectional view showing various modified structural examples of the support block portion illustrated in FIG. 22.

FIG. 23 shows various structures for stabilizing the load in the support block portion 10m. In this figure there are illustrated a structure wherein the elastic film 10t is thinned by seal thinning to enhance the responsivity of the elastic film, a structure wherein the elastic film 10t is made into a diaphragm type by rise thinning, a structure wherein a gap is formed between adjacent pressure blocks 10n by plunger pitch expansion, and a structure wherein deflections are ensured in the elastic film 10t at positions each corresponding to locations between adjacent pressure blocks 10n by a seal buffer mechanism to make motions of the pressure blocks 10n difficult to be mutually influenced.

In the semiconductor integrated circuit device fabricating method according to this embodiment, die bonding is carried out in a divided manner using the first heating stage 9b and the second heating stage 10b. Temporary bonding (temporary compression bonding) is performed in a short time in the first heating stage 9b; and, thereafter, plural semiconductor chips 1 are subjected to a main bonding (main compression bonding) in the second heating stage 10b, whereby it is possible to shorten the bonding time.

Consequently, it is possible to improve the throughput of die bonding and, hence, to improve the productivity thereof.

Moreover, since the application of pressure can be carried out over a relatively long time in the second heating stage 10b, the heating temperature can be set lower than in the conventional die bonding method.

As a result, in the case where the matrix substrate 3g is an organic substrate having wires 3d, it is possible to diminish deformations, such as warping of the organic substrate, and it is also possible to diminish the occurrence of defects, such as peel-off of wiring patterns.

More particularly, in an organic substrate, a solder resist film serving as an insulating film (organic layer) on the substrate surface and copper wires are markedly different in thermal expansion coefficient from each other; and, if the heating temperature is high, peeling of wiring patterns and substrate deformation caused by such a difference in thermal expansion coefficient are apt to occur. In this embodiment, however, since the heating temperature can be set low, it is possible to diminish the occurrence of the aforesaid defects of the organic substrate. Further, since substrate deformation can be diminished, it is possible to stabilize the adhesion between the substrate and the semiconductor chips 1.

In the conventional bonding of a wiring substrate and semiconductor chips 1 by flip-chip connection, the semiconductor wafers 1 are picked up from a semiconductor wafer and are placed on the substrate such that their main surfaces 1b face toward the substrate, and then the semiconductor chips 1 and the wiring substrate are bonded together by thermocompression bonding, for example. In this case, a conveyance mechanism for conveying the semiconductor chips 1 onto the substrate is disposed above the wiring substrate. Since the conveyance mechanism is thus disposed above the wiring substrate, it is difficult to dispose a heating mechanism above the substrate and, therefore, it is embedded in a stage located below the wiring substrate. When heating is conducted from the stage side in this structure, the chip-substrate bonding portions are heated through the substrate, so that the temperature of the bonding portions does not rise to a satisfactory extent and insufficient bonding results. Further, if the heating temperature is raised in an effort to ensure a sufficient temperature of the bonding portions, the wiring substrate may undergo a deformation, such as warping, or there may occur peeling of the compression-bonded portions.

In contrast therewith, in the semiconductor integrated circuit device fabricating method according to this embodiment, when die bonding is to be conducted, the semiconductor chips 1 are disposed on a heating stage such that their main surfaces 1b face upward, and the matrix substrate 3g is disposed above the semiconductor chips 1. Then, then in this state, both are bonded together. Therefore, the back surfaces 1c of the semiconductor chips 1 can be heated directly without interposition of the substrate, whereby the chips can be heated efficiently.

As a result, not only can the bonding portions between the semiconductor chips 1 and the matrix substrate 3g can be heated to a satisfactory extent, but also the heating temperature from the substrate side can be set lower than on the chip side. Consequently, it is possible to diminish a thermal deformation of the wiring substrate.

Further, since the bonding portions between the semiconductor chips and the wiring substrate can be heated to a satisfactory extent, it is possible to stabilize the bonding of the semiconductor chips 1. Accordingly, it is possible to prevent the occurrence of such inconveniences as peel-off of the bonded portions (compression-bonded portions), and it is possible to stabilize the bonding quality of the semiconductor chips. Hence, it is possible to improve the reliability of the products obtained.

In the case of using thinned semiconductor chips 1 with thinning of the semiconductor integrated circuit device, such as BOC 7, the use of a chip inverting mechanism is needed in the bonding between the wiring substrate and the semiconductor chips 1 by the conventional flip-chip connection, and it becomes difficult to handle thinned chips. Consequently, inconveniences are apt to occur at the time of inverting the chips.

In contrast therewith, in the semiconductor integrated circuit device fabricating method according to this embodiment, the semiconductor chips 1 are placed on the stage so that their main surfaces 1b face upward without using the chip inverting mechanism. Thus, since the chip inverting mechanism becomes unnecessary, the structure of the semiconductor device manufacturing apparatus can be so much simplified. Besides, since the semiconductor chips 1 are heated on the stage directly from their back surfaces 1c side without interposition of the substrate, the bonding portions between the semiconductor chips and the wiring substrate can be heated more efficiently corresponding to the thinning of the semiconductor chips 1.

Although the present invention has been described above by way of embodiments thereof, it goes without saying that the invention is not limited to the above-described embodiments, but that various changes may be made within a scope not departing from the gist of the invention.

For example, although in the above-description of the embodiments reference has been made to BOC 7 as an example of the semiconductor integrated circuit device, the semiconductor device is not limited to the BOC 7 insofar as the semiconductor device used is assembled by bonding a semiconductor chip 1 and a substrate, such as the matrix substrate 3g, to each other.

Figure 24:
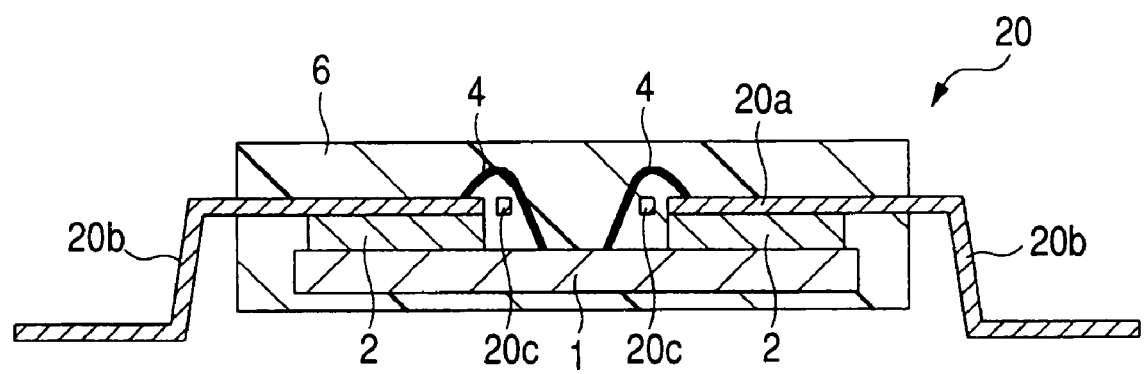
FIG. 24 is a sectional view showing the structure of a semiconductor integrated circuit device according to a modification in the present invention.

The semiconductor device may be, for example, an LOC (Lead On Chip) 20 such as shown in FIG. 24. In the LOC 20, inner leads 20a and a semiconductor chip 1 are bonded together through die bonding tapes 2. The inner leads 20a and the semiconductor chip 1 are electrically connected with each other through wires 4 while straddling bus bar leads 20c. Further, outer leads 20b are formed in a gull wing shape.

In assembling the LOC 20, the semiconductor integrated circuit device fabricating method according to this embodiment is applied at the time of bonding the semiconductor chip and a lead frame (substrate) having the inner leads 20a and the outer leads 20b.

The present invention is suitable for its application to a semiconductor integrated circuit device fabricating technique involving the bonding of a substrate and semiconductor chips to each other.

What is claimed is:

1. A method of fabricating a semiconductor integrated circuit device, comprising the steps of:
   (a) providing an organic wiring substrate;
   (b) disposing a plurality of semiconductor chips over a first stage;
   (c) disposing the substrate at first main surface sides of the semiconductor chips over the first stage and bonding the semiconductor chips and the substrate to each other temporarily by thermocompression bonding while heating the semiconductor chips from the second main surface sides of the chips over the first stage;
   (d) after the step (c), disposing the temporarily bonded semiconductor chips and substrate over a second stage adjacent to the first stage; and
   (e) pressurizing the semiconductor chips over the second stage for a longer time than in the first stage while heating the semiconductor chips from the second main surface sides of the chips to effect a main bonding of the semiconductor chips and the substrate by thermocompression bonding, wherein the heating of the semiconductor chips from the second main surface sides of the chips over the second stage is performed directly without interposition of the organic wiring substrate.

2. A method according to claim 1, wherein the plural semiconductor chips are disposed over the second stage and are subjected all together to a main bonding to the substrate by the thermocompression bonding while being heated directly by the second stage.

3. A method according to claim 1, wherein the organic wiring substrate is a multi-layer wiring substrate.

4. A method according to claim 3, wherein the temperature of the heating of the semiconductor chips from the second main surface sides of the chips over the second stage is lower than the glass transition temperature of an organic resin which constitutes a principal portion of the organic wiring substrate.

5. A method according to claim 1, wherein the bonding between the semiconductor chips and the substrate is performed through an organic layer lower in modulus of rigidity than an organic resin which constitutes a principal portion of the substrate.

* * * * *